US009691756B2

(12) United States Patent
Kwon

(10) Patent No.: US 9,691,756 B2
(45) Date of Patent: Jun. 27, 2017

(54) NONVOLATILE MEMORY DEVICE AND METHOD OF FABRICATING THE SAME

(71) Applicant: Euipil Kwon, San Jose, CA (US)

(72) Inventor: Euipil Kwon, San Jose, CA (US)

(73) Assignee: Rangduru Inc., San Jose, CA (US)

( * ) Notice: Subject to any disclaimer, the term of this patent is extended or adjusted under 35 U.S.C. 154(b) by 705 days.

(21) Appl. No.: 13/750,387

(22) Filed: Apr. 22, 2013

(65) Prior Publication Data

US 2013/0249017 A1 Sep. 26, 2013

(30) Foreign Application Priority Data

Feb. 22, 2012 (KR) ........................ 10-2012-0018181

(51) Int. Cl.

| | |
|---|---|
| ***H01L 27/06*** | (2006.01) |
| ***H01L 29/66*** | (2006.01) |
| ***H01L 21/84*** | (2006.01) |
| ***H01L 29/68*** | (2006.01) |
| ***H01L 27/102*** | (2006.01) |
| ***H01L 29/861*** | (2006.01) |
| ***H01L 27/112*** | (2006.01) |
| ***H01L 29/872*** | (2006.01) |
| ***H01L 27/12*** | (2006.01) |
| ***H01L 29/06*** | (2006.01) |
| ***G11C 11/4094*** | (2006.01) |
| ***G11C 11/4097*** | (2006.01) |
| ***G11C 16/04*** | (2006.01) |

(52) U.S. Cl.

CPC ...... *H01L 27/0629* (2013.01); *G11C 11/4094* (2013.01); *G11C 11/4097* (2013.01); *G11C 16/0466* (2013.01); *H01L 21/84* (2013.01); *H01L 27/1021* (2013.01); *H01L 27/11206* (2013.01); *H01L 27/1203* (2013.01); *H01L 29/0649* (2013.01); *H01L 29/66477* (2013.01); *H01L 29/685* (2013.01); *H01L 29/8611* (2013.01); *H01L 29/872* (2013.01); *G11C 2207/005* (2013.01); *G11C 2211/4016* (2013.01)

(58) Field of Classification Search

CPC ............. H01L 29/0638; H01L 29/0642; H01L 29/0653; H01L 27/0629; H01L 29/66477

See application file for complete search history.

(56) References Cited

U.S. PATENT DOCUMENTS

| | | | | |
|---|---|---|---|---|
| 6,165,850 | A * | 12/2000 | Wu | 438/275 |
| 2002/0142531 | A1 * | 10/2002 | Hsu et al. | 438/183 |

FOREIGN PATENT DOCUMENTS

| | | |
|---|---|---|
| KR | 2001-0056831 | 7/2001 |
| KR | 10-20070002662 A | 1/2007 |

* cited by examiner

*Primary Examiner* — Ermias Woldegeorgis
(74) *Attorney, Agent, or Firm* — Goldilocks Zone IP Law

(57) ABSTRACT

The nonvolatile memory device includes a memory cell having a transistor in which an insulating isolation layer is formed in a channel region. The nonvolatile memory device includes a metal-oxide-semiconductor (MOS) transistor as a basic component. An insulating isolation layer is formed in at least a channel region, and a gate insulating layer includes an insulating layer or a variable resistor and serves as a data storage. A gate includes a metal layer formed in a lower portion thereof. First source and drain regions are lightly doped with a dopant, and second source and drain regions are heavily doped with a dopant.

36 Claims, 33 Drawing Sheets

254

250

250

250

250

250

250

250

250

256

274

NONVOLATILE MEMORY DEVICE AND METHOD OF FABRICATING THE SAME

CROSS-REFERENCE TO RELATED APPLICATION

This application claims priority under 35 U.S.C. §119 to Korean Patent Application No. 10-2012-0018181 filed on Feb. 22, 2012, the disclosure of which is hereby incorporated by reference in its entirety.

BACKGROUND

1. Field

Embodiments of the inventive concept relate to a nonvolatile memory device and a method of fabricating the same and, more particularly, to a nonvolatile memory device including a memory cell having a transistor in which an insulating isolation layer is formed in a channel region and a method of fabricating the memory device.

2. Description of Related Art

A conventional art disclosed in Korean Patent Publication No. 2001-0056831 relates to a method of forming an anti-fuse of a semiconductor device, more specifically, a method of forming an anti-fuse of a semiconductor device, which may easily break an insulating layer at a lower voltage using a right-angled corner of a semiconductor substrate. The disclosed method includes forming a predetermined pattern on a semiconductor substrate on which a process for a lower structure is completely performed to form a structure having right-angled corners, depositing a gate oxide layer and stacking a nitride layer/a first polysilicon (poly-Si) layer on the gate oxide layer, forming a photoresist pattern to expose the first poly-Si layer formed on the right-angled corners of the semiconductor substrate, dry etching the exposed first poly-Si layer to firstly expose the nitride layer formed on the right-angled corners of the semiconductor substrate, dry etching the nitride layer, and depositing a second poly-Si layer and forming a pattern. In the above-described method of forming the anti-fuse of the semiconductor device, an anti-fuse capable of easily breaking an insulating layer at a lower voltage may be fabricated.

Another conventional art disclosed in Korean Patent Publication No. 1997-0067848 relates to a semiconductor memory device and a method of fabricating the same. The semiconductor memory device includes an access transistor T configured to access information of word lines, a storage node capacitor C configured to store information stored through a bit line due to an operation of the access transistor T, and a charge-up transistor P configured to supply charges to the storage node capacitor C. In the above-described semiconductor memory device, charges may be continuously supplied to the storage node capacitor C so that a processing speed of the semiconductor memory device can be improved.

Meanwhile, a nonvolatile semiconductor memory device may be a semiconductor memory device in which information stored in a memory cell is retained even if power supply is not interrupted.

The nonvolatile memory device may be electrically programmed. A memory device related with the inventive concept may store data by the principle that when a high voltage for a program operation is applied between insulating layers or variable resistors serving as storage layers, resistances of the insulating layers or the variable resistors vary.

The nonvolatile memory device may include memory cells in which storage layers include insulating layers or variable resistors.

When the storage layers include the insulating layers, a high voltage for a program operation may be applied to both electrodes (i.e., a first electrode and a second electrode) between the insulating layers to cause a breakdown. In this case, a resistive path may be generated so that the insulating layers may be changed from an insulation state to a conduction state. Accordingly, the insulating layers may become anti-fuses. When the insulating layers are in the conduction state, the nonvolatile memory device may be in a programmed state, and the programmed state may be defined as storage of data '0.' Also, when the insulating layers are in the insulation state, the nonvolatile memory device may be in an unprogrammed state, and the unprogrammed state may be defined as storage of data '1.'

Conversely, the conduction state may be defined as data '1,' and the insulation state may be defined as data '0.'

When the storage layers are the variable resistors, the variable resistors may include a resistance variable material or a phase transition material.

In a case in which the variable resistors of the memory cell include the resistance variable material, when a voltage equal to or higher than a set voltage is applied to both electrodes (i.e., a first electrode and a second electrode) between the variable resistors, the variable resistors may be put into a low resistance state, and when a voltage equal to or higher than a rest voltage is applied to the first and second electrodes between the variable resistors, the variable resistors may be put into a high resistance state. Accordingly, the low resistance state may be defined as storage of data '0,' and the high resistance state may be defined as storage of data '1.' Conversely, the low resistance state may be defined as storage of data '1,' and the high resistance state may be defined as storage of data '0.'

The resistance variable material is being developed using various materials, such as perovskite, transition metal oxides, and chalcogenides.

Memory devices using the resistance variable material may be classified into several types according to materials. A first type is a memory device in which a colossal magnetoresistance (CMR) material, such as $Pr_{1-x}Ca_xMnO_3$ (PCMO), is inserted between electrodes and a variation in resistance due to an electric field is used. A second type is a memory device in which a binary oxide, such as niobium oxide ($Nb_2O_5$), titanium oxide ($TiO_2$), nickel oxide (NiO), or aluminum oxide ($Al_2O_3$), is prepared to have a nonstoichiometric composition and used as a resistance variable material. A third type is a memory device in which a chalcogenide material maintains an amorphous structure and a difference in resistance due to a variation in the threshold voltage of an ovonic switch is used, instead of supplying a large current to the chalcogenide material to change the phase of the chalcogenide material as in a phase-change random access memory (PRAM). A fourth type is a memory device in which a ferroelectric material, such as strontium titanium oxide ($SrTiO_3$) or strontium zirconium oxide ($SrZrO_3$), is doped with chromium (Cr) or Nb to change a resistance state. A final type is a memory device including programmable metallization cells (PMCs) in which silver (Ag) having a high ion mobility is doped into a solid electrolyte, such as germanium selenium (GeSe), so that two resistance states are formed depending on whether or not a conductive channel is formed in a medium due to an electrochemical reaction. In addition, materials or fabrication processes capable of embodying two stable resistance states to obtain memory characteristics have been reported.

In a case in which the variable resistors of the memory cell include the phase transition material, when the phase transition material is in a low resistance state, the low resistance state may be defined as storage of data '0,' and when the phase transition material is in a high resistance state, the high resistance state may be defined as storage of data '1.' Conversely, the low resistance state may be defined as storage of data '1,' and the high resistance state may be defined as storage of data '0.'

The phase transition material may be changed into a crystalline phase or an amorphous phase due to a predetermined current. The crystalline phase may correspond to the low resistance state, and the amorphous phase may correspond to the high resistance state.

FIG. 1 is a cross-sectional view of a storage N-channel MOS transistor 990 for explaining a conventional technique related with the inventive concept. Referring to FIG. 1, a typical N-channel MOS transistor 990 may include a thin oxide layer 935, a gate 940 formed of polycrystalline silicon (poly-Si) on the oxide layer 935, sidewall spacers 925 formed on sidewalls of the gate 940, and a source region 926 and a drain region 927 formed apart from each other with the gate 940 therebetween. The source and drain regions 926 and 927 may be doped with an N-type dopant at a high concentration and a low concentration, respectively, and a semiconductor substrate 915 may be doped with a P-type dopant at a low concentration. In the storage N-channel MOS transistor 990, a ground voltage GND having a voltage of about 0 V may be connected to the gate 940, and a program operation may be enabled on the principle that a gate breakdown may be caused in the oxide layer 935 by applying a high voltage to the source region 926 or the drain region 927 to generate a resistive path. Accordingly, an access MOS transistor capable of applying a high voltage for the program operation to the source region 926 or the drain region 927 may be required. A resistive path 936 generated in the oxide layer 935 between the gate 940 and the source region 926 and a resistive path 937 generated in the oxide layer 935 between the gate 940 and the drain region 927, which are paths in which a gate breakdown occurs, are separately illustrated with solid lines for clarity. A thin oxide MOS transistor is used as the storage N-channel MOS transistor 990, while a thick oxide MOS transistor appropriate for high-voltage operations should be used as the access MOS transistor. Also, since the access MOS transistor is needed, there is a fundamental limit to increasing the integration density of memory devices.

FIG. 2 is a circuit diagram of a memory cell 910 including two access N-channel MOS transistors 901 and 902 and one storage N-channel MOS transistor 900, for explaining a conventional technique related with the inventive concept. Referring to FIG. 2, a gate of the storage N-channel MOS transistor 900 may be connected to a ground GND having a voltage of about 0 V. Gates of the access N-channel MOS transistors 901 and 902 may be respectively connected to word lines WL0 and WL1, drains of the access N-channel MOS transistors 901 and 902 may be respectively connected in common to a bit line BL, and sources of the N-channel MOS transistors 901 and 902 may be respectively connected to a source 956 and a drain 957 of the storage N-channel MOS transistor 900.

The above-described configuration of the access N-channel MOS transistors 901 and 902 may be fundamentally limited when it comes to increasing the integration density of memory devices.

To apply a high voltage for a program operation to the source 956 or the drain 957 of the storage N-channel MOS transistor 900 as described above, a high voltage should be transmitted through the access N-channel MOS transistors 901 and 902. Accordingly, a high voltage should be applied to the common bit line BL, and a higher voltage should be applied to the selected word line WL0 to WL1.

According to the conventional techniques, since two oxide MOS transistors having different thicknesses should be formed at a high density in a memory cell, a fabrication process becomes relatively intricate. Also, since three transistors are required to form a memory cell capable of storing 2-bit data, there is a fundamental limit to increasing the integration density of memory devices.

SUMMARY

Embodiments of the inventive concept provide a memory cell capable of storing 1-bit data or 2-bit data to obtain a higher integration density than in the conventional art. The memory cell includes one transistor serving as a basic structure, a gate insulating layer is formed of an insulating layer or a variable resistor, and a channel region includes an insulating isolation layer.

Other embodiments of the inventive concept provide methods of operating and fabricating the memory cell.

Furthermore, other embodiments of the inventive concept provide a memory array including the memory cell, a semiconductor memory device including the memory array, and a method of operating the memory array. Also, it may be easily understood that aspects and advantages of the inventive concept may be realized by units described in the claims and combinations thereof.

The technical objectives of the inventive disclosure are not limited to the above disclosure; other objectives may become apparent to those of ordinary skill in the art based on the following descriptions.

In accordance with an aspect of the inventive concept, a nonvolatile memory device includes a metal-oxide-semiconductor (MOS) transistor serving as a basic component. The MOS transistor includes a semiconductor substrate, a gate insulating layer formed on the semiconductor substrate, a gate stacked on the gate insulating layer, and source and drain regions. The source region includes a first source region including a region intersecting the gate insulating layer and a second source region corresponding to the remaining source region other than the first source region, the first source region is lightly doped with a dopant, and the second source region is heavily doped with a dopant. The drain region includes a first drain region including a region intersecting the gate insulating layer and a second drain region corresponding to the remaining drain region other than the first drain region, the first drain region is lightly doped with a dopant, and the second drain region is heavily doped with a dopant. An insulating isolation layer is formed in a region including a channel region between the source and drain regions in the semiconductor substrate. The gate has a lower portion including a metal layer, the gate insulating layer includes an insulating layer or a variable resistor, a portion of the gate insulating layer between the metal layer and the first source region serves as a first storage layer, and a portion of the gate insulating layer between the metal layer and the second drain region serves as a second storage layer.

In accordance with another aspect of the inventive concept, a nonvolatile memory device includes a memory cell including a MOS transistor serving as a basic component. The MOS transistor includes a semiconductor substrate, a gate insulating layer formed on the semiconductor substrate, a gate stacked on the gate insulating layer, and source and drain regions. The source region includes a first source region including a region intersecting the gate insulating layer and a second source region corresponding to the remaining source region other than the first source region. The drain region includes a first drain region including a region intersecting the gate insulating layer and a second drain region corresponding to the remaining drain region other than the first drain region. The first and second source regions form a first diode structure and the first and second drain regions form a second diode structure, or a source electrode connected to the second source region and the second source region form the first diode structure and a drain electrode connected to the second drain region form the second diode structure. An insulating isolation layer is formed in a region including a channel region between the source and drain regions in the semiconductor substrate. The gate includes a conductive layer, and the gate insulating layer includes an insulating layer or a variable resistor and serves as a data storage.

In addition, the nonvolatile memory device may further include a third source region formed between the first source region and the semiconductor substrate and a third drain region formed between the first drain region and the semiconductor substrate.

In accordance with another aspect of the inventive concept, a nonvolatile memory device includes a MOS transistor serving as a basic component. The MOS transistor includes a semiconductor substrate, a gate insulating layer formed on the semiconductor substrate, a gate stacked on the gate insulating layer, and a source region. The source region includes a first source region including a region intersecting the gate insulating layer and a second source region corresponding to the remaining source region other than the first source region, the first source region is lightly doped with a dopant, and the second source region is heavily doped with a dopant. An insulating isolation layer is formed in a region including a channel region in the semiconductor substrate and expands to a drain region. The gate has a lower portion including a metal layer, the gate insulating layer includes an insulating layer or a variable resistor, a portion of the gate insulating layer between the metal layer and the first source region serves as a first storage layer configured to store data, and the gate including the first storage layer and the source region constitute a first bit cell.

In accordance with another aspect of the inventive concept, a nonvolatile memory device includes a MOS transistor serving as a basic component. The MOS transistor includes a semiconductor substrate, a gate insulating layer formed on the semiconductor substrate, a gate stacked on the gate insulating layer, and a drain region. The drain region includes a first drain region including a region intersecting the gate insulating layer and a second drain region corresponding to the remaining drain region other than the first drain region, the first drain region is lightly doped with a dopant, and the second drain region is heavily doped with a dopant. An insulating isolation layer is formed in a region including a channel region in the semiconductor substrate and extends to a source region. The gate has a lower portion including a metal layer, the gate insulating layer includes an insulating layer or a variable resistor, a portion of the gate insulating layer between the metal layer and the first drain region serves as a second storage layer configured to store data, and the gate including the second storage layer and the drain region constitute a second bit cell.

When the first storage layer is in an electrical conduction state, the gate and the first source region may form a first diode, or when the second storage layer is in an electrical conduction state, the gate and the first drain region may form a second diode.

Sidewall spacers may be further formed on sidewalls of the gate, and the insulating isolation layer may be formed using a shallow trench isolation (STI) technique.

A gate electrode connected to the gate may be connected to a word line, a source electrode connected to the source region or a drain electrode connected to the drain region may be connected to a bit line. Alternatively, the gate electrode may be connected to the bit line, and the source electrode or the drain electrode may be connected to the word line.

The second source region or the second drain region of one memory cell may run in one direction and be shared with and be directly connected to a second source region or a second drain region of another memory cell arranged in the one direction without passing through a contact.

The gate insulating layer may be divided by the insulating isolation layer into the first storage layer and the second storage layer, and the insulating isolation layer may prevent generation of a resistive path in the gate insulating layer between the gate and the semiconductor substrate during a program operation of the insulating isolation layer.

The first and second source regions of the first diode structure or the first and second drain regions of the second diode structure may respectively include an N-type semiconductor and a P-type semiconductor or respectively include a P-type semiconductor and an N-type semiconductor to a PN junction diode, respectively include a semiconductor and a metal or respectively include a semiconductor and a metal to form a Schottky diode, or respectively include other materials having diode characteristics.

The metal layer may include a metal, a silicide, a metal compound, or a material having diode characteristics when bonded to a semiconductor.

During a program operation performed on a memory array in which a gate electrode connected to the gate is connected to a word line and a source electrode and a drain electrode respectively connected to the source and drain regions are respectively connected to bit lines, when a word line is selected, a VPP voltage may be applied to the selected word line, and other unselected word lines may be precharged to a voltage of about 0 V and put into a floating state. Alternatively, during a program operation performed on a memory array in which the gate electrode is connected to a bit line, and the source and drain electrodes are respectively connected to word lines, when a word line is selected, a voltage of about 0 V may be applied to the selected word line, and other unselected word lines may be precharged to a VPP voltage and put into a floating state. When the first bit cell is programmed, a voltage of about 0 V may be applied to the source electrode. When the second bit cell is programmed, a voltage of about 0 V may be applied to the drain electrode. When the first bit cell is prevented from being programmed during the program operation, the source electrode may be put into the floating state. Also, when the second bit cell is prevented from being programmed during the program operation, the drain electrode may be put into the floating state.

A write circuit may include a bit line precharge circuit including transistors to be controlled in response to a write precharge signal. When a gate electrode connected to the gate is connected to a word line and source and drain electrodes respectively connected to the source and drain regions are respectively connected to bit lines, a column decoder may precharge bit lines to a VPP voltage. When the gate electrode connected to the gate is connected to a bit line and the source and drain electrodes are respectively connected to word lines, the column decoder may precharge bit lines to a voltage of about 0 V.

A read circuit required for a read operation may include bit lines connected to global bit lines and configured to be selected due to a column decoding operation and a sense amplifier configured to transmit electrical states of the bit lines to the global bit lines and read stored data. When a gate electrode connected to the gate is connected to a word line and source and drain electrodes respectively connected to the source and drain regions are respectively connected to bit lines, the device may further include a transistor configured to precharge the global bit lines to a voltage of about 0 V. When the gate electrode is connected to a bit line and the source and drain electrodes are respectively connected to word lines, the device may further include a transistor configured to precharge the global bit lines to a VCC voltage.

In accordance with another aspect of the inventive concept, a method of fabricating a nonvolatile memory device includes preparing a semiconductor substrate, forming an insulating isolation layer in a semiconductor substrate, implanting a dopant complementary to the semiconductor substrate at a low concentration to form a first source region and a first drain region, stacking a gate insulating layer on a semiconductor substrate, forming a gate including a metal layer and a conductive layer, forming sidewalls on sidewalls of the gate, and implanting a dopant complementary to the semiconductor substrate at a high concentration to form a second source region and a second drain region.

In accordance with another aspect of the inventive concept, a method of fabricating a nonvolatile memory device includes preparing a semiconductor substrate, forming an insulating isolation layer in a semiconductor substrate, implanting a complementary dopant to the semiconductor substrate to form a third source region and a third drain region, implanting a complementary dopant to the third source and drain regions to form a first source region and a first drain region, stacking a gate insulating layer on the semiconductor substrate, forming a gate including a conductive layer, forming sidewall spacers on sidewalls of the gate, and implanting a complementary dopant to the semiconductor substrate to form a second source region and a second drain region.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The following detailed description is merely exemplary in nature and is not intended to limit the application and uses contemplated herein. Furthermore, there is no intention to be bound by any theory presented in the preceding background or the following detailed description.

The inventive concept will now be described more fully hereinafter with reference to the accompanying drawings, in which embodiments of the inventive concept are shown.

A structure according to the inventive concept may be formed on a semiconductor substrate including a bulk silicon wafer or a silicon thin layer disposed on an insulating layer (typically referred to as a silicon-on-insulator (SOI)).

Hereinafter, a state in which a resistive path is not present in a gate insulating layer of a cell transistor will be defined as data '1,' and a state in which the resistive path is formed in the gate insulating layer of the cell transistor will be defined as data '0.' The inventive concept is not limited thereto. For example, the state in which the resistance path is not present will be defined as data '0,' and the state in which the resistance path is formed will be defined as data '1.'

Hereinafter, write and read circuits and write and read operations according to an embodiment of the inventive concept will be briefly described by denoting bit lines will be briefly denoted by BL0 and BL1, global bit lines by GBL0 and GBL1, write data input signals by WD0 and WD1, read data output signals by RD0 and RD1. That is, each of the bit lines, the global bit lines, the write data input signals, and the read data output signals has a 2-bit data bus in the embodiment of the inventive concept, but the inventive concept is not limited thereto.

Figure 1:
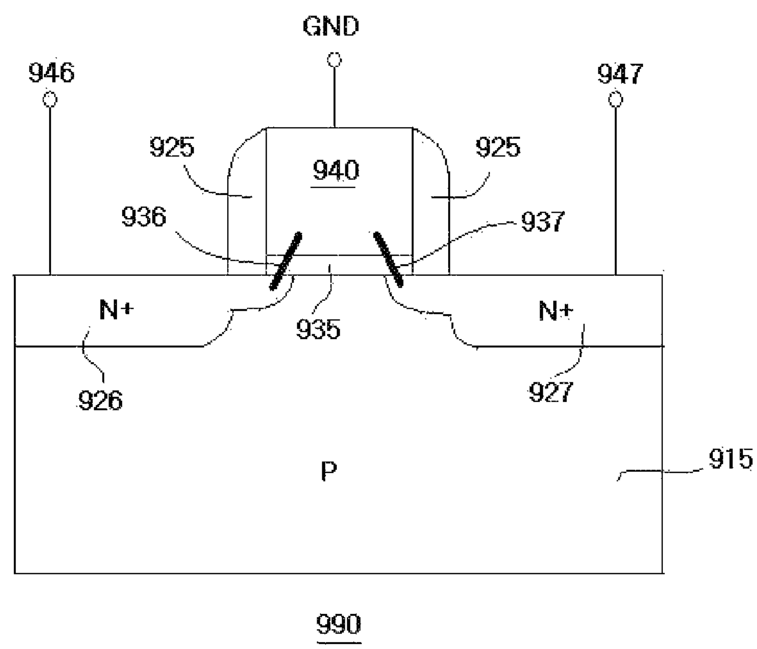
FIG. 1 is a cross-sectional view of a conventional storage MOS transistor according to an embodiment of the inventive concept.
Figure 2:
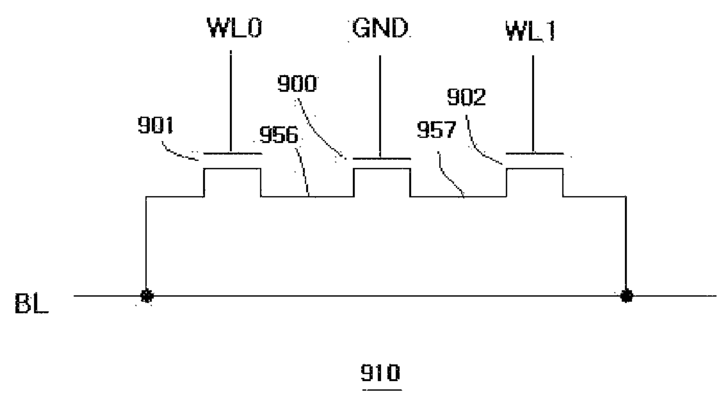
FIG. 2 is a circuit diagram of a conventional memory cell.
Figure 3A:
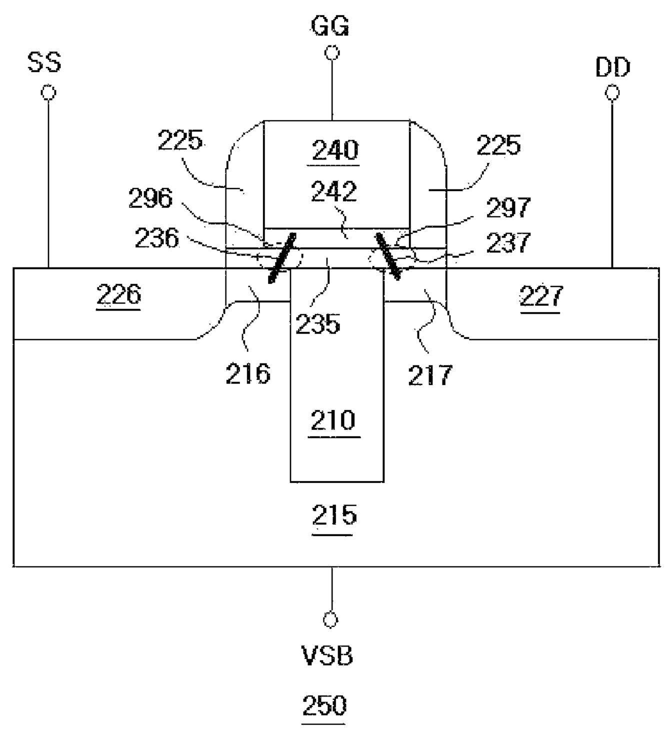
FIG. 3A is a cross-sectional view of a memory cell according to an embodiment of the inventive concept.

FIG. 3A is a cross-sectional view of a memory cell 250 according to an embodiment of the inventive concept.

Figure 4A:
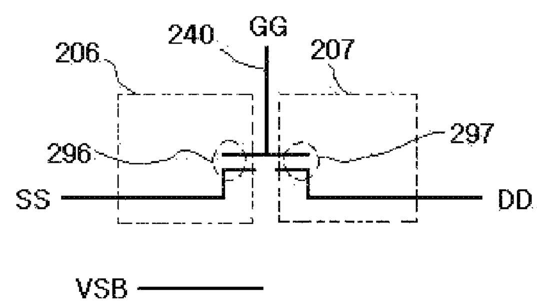
FIG. 4A is a circuit diagram of a memory cell according to an embodiment of the inventive concept.

FIG. 4A is a circuit diagram of the memory cell 250 shown in FIG. 3A, according to an embodiment of the inventive concept.

Figure 5A:
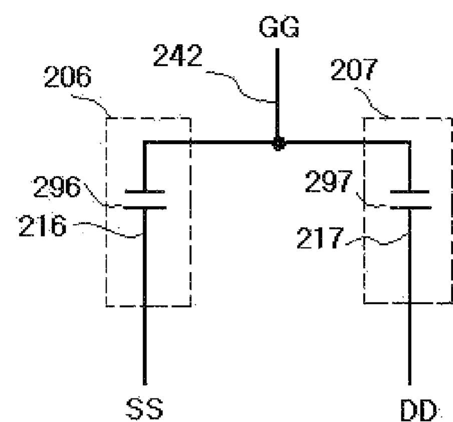
FIGS. 5A and 5B are simplified equivalent circuit diagrams showing a pre-program state of a memory cell according to an embodiment of the inventive concept, in which a gate insulating layer is replaced with a capacitor.
Figure 5B:
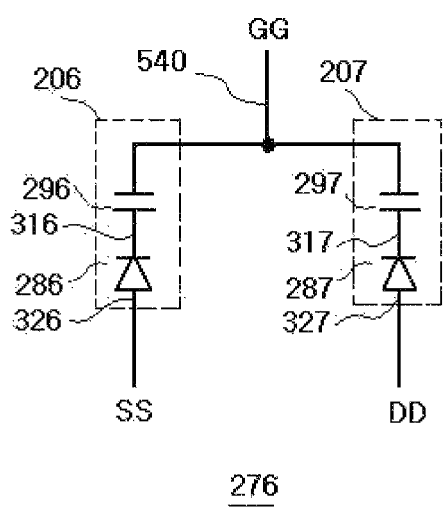

FIGS. 5A and 5B are simplified equivalent circuit diagrams for facilitating the understanding of a memory cell according to an embodiment of the inventive concept.

As shown in FIG. 3A, the memory cell 250 according to the embodiment of the inventive concept may include one metal gate transistor in which a channel region includes an insulating isolation layer 210. Referring to FIG. 4A, unlike a typical transistor, a source electrode SS may be disconnected from a drain electrode DD due to an electrical isolation function of the insulating isolation layer 210 shown in FIG. 3A.

Specifically, the memory cell 250 shown in FIG. 3A may include a MOS transistor similar to a typical MOS transistor as a basic component. Specifically, the memory cell 250 may include a semiconductor substrate 215, a gate 240 and 242 stacked on a gate insulating layer 235, a gate electrode GG connected to the gate 240, sidewall spacers 225 formed on sidewalls of the gate 240 and 242, a source region 216 and 226, a source electrode SS connected to the source region 216 and 226, a drain electrode 217 and 227, and a drain electrode DD connected to the drain region 217 and 227. The gate 240 and 242 may include a metal layer 242 and a conductive layer 240 stacked on the metal layer 242.

Furthermore, the inventive concept is characterized in that an insulating isolation layer 210 may be formed between the source region 216 and 226 and the drain region 217 and 227, that is, in a region including a channel region.

Although the present embodiment pertains to an example in which sidewall spacers are formed, the inventive concept is not limited thereto and may be applied to a modified example in which sidewall spacers are not formed.

As shown in FIG. 3A, the source region 216 and 226 may include a first source region 216 and a second source region 226. The first source region 216 may refer to a region of the source region 216 and 226, which may intersect the gate insulating layer 235 or the sidewall spacers 225. The first source region 216 may be lightly doped with a dopant, and the second source region 226 may be heavily doped with the dopant.

Also, as shown in FIG. 3A, the drain region 217 and 227 may include a first drain region 217 and a second drain region 227. The first drain region 217 may refer to a region of the drain region 217 and 227, which may intersect the gate insulating layer 235 or the sidewall spacers 225. The first drain region 217 may be lightly doped with a dopant, and the second drain region 227 may be heavily doped with the dopant.

As shown in FIG. 3A, an insulating isolation layer 210 may be formed in the channel region, the gate 242 may be the metal layer, and the gate insulating layer 235 may include an insulating layer or a variable resistor and serve as a data storage.

As shown in FIG. 3A, the gate insulating layer 235 between the gate 242 and the first source region 216 may serve as a first storage configured to store data, and be separately illustrated with a dotted ellipse for clarity.

The first storage, which is a portion of the gate insulating layer 235, may become a first storage layer 296. The gate 242 including the first storage layer 296 and the source region 216 and 226 may constitute a first bit cell.

As shown in FIG. 3A, the gate insulating layer 235 between the metal layer 242 of the gate 240 and 242 and the first drain region 217 may serve as a second storage configured to store data and be separately illustrated with a dotted ellipse for clarity.

The second storage, which is a portion of the gate insulating layer 235, may become a second storage layer 297. The gate 242 including the second storage layer 297 and the drain region 217 and 227 may constitute a second bit cell.

In FIG. 3A, the semiconductor substrate 215 may be typically doped with a P-type or N-type dopant.

In an embodiment of the inventive concept, it is assumed that the semiconductor substrate 215 is a P type. Accordingly, the first source region 216 and the first drain region 217 may become an N-type semiconductor that is lightly doped with a complementary dopant to the semiconductor substrate 215, and the second source region 226 and the second drain region 227 may become an N-type semiconductor that is heavily doped with a dopant similar to the semiconductor substrate 215.

As is widely known to one skilled in the art, when a lightly doped semiconductor is in contact with a metal, a Schottky diode may be formed.

The inventive concept is characterized in that, based on the above-described principle, when the gate insulating layer 235 (i.e., the first storage layer 296) between the gate 242 and the first source region 216 is in an electrical conduction state, the metal layer 242 and the first source region 216 may constitute a Schottky diode.

Also, the inventive concept is characterized in that, based on the above-described principle, when the gate insulating layer 235 (i.e., the second storage layer 297) between the metal layer 242 and the first drain region 217 is in an electrical conduction state, the metal layer 242 and the first drain region 217 may constitute a Schottky diode.

In other words, when the first storage layer 296 is in an electrical conduction state, the gate 242 and the first source region 216 may constitute a first diode, and when the second storage layer 297 is in an electrical conduction state, the gate 242 and the first drain region 217 may constitute a second diode.

Furthermore, the inventive concept may be applied to a case in which the metal layer 242 forms the entire gate. That is, the metal layer 242 of the gate may be formed in at least the lower portion of the gate or constitute the entire gate.

In another embodiment of the inventive concept, a region in which the insulating isolation layer 210 is formed may include a channel region so that both a source region and a drain region can be provided. Alternatively, a region in which the insulating isolation layer 210 is formed may include a channel region and any one of a source region and a drain region, so any one of the source and drain regions may not be provided. These embodiments are shown in FIG. 3B.

Figure 3B:
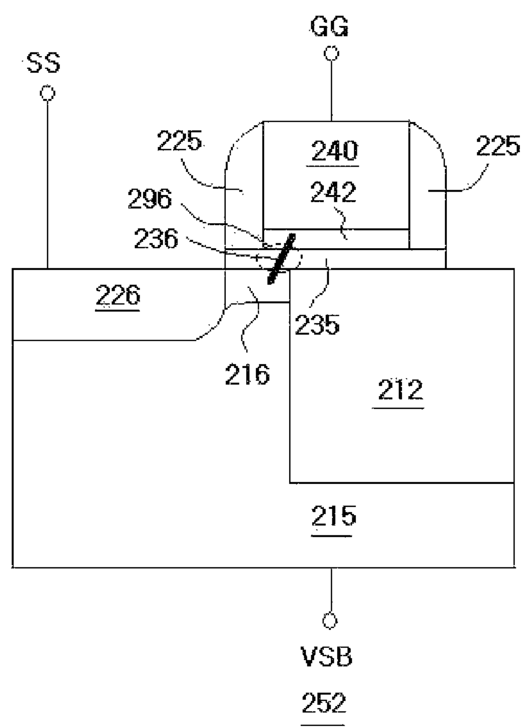
FIG. 3B is a cross-sectional view of a memory cell according to another embodiment of the inventive concept.

As compared with FIG. 3A, FIG. 3B shows a case in which an insulating isolation layer 212 expands to a drain region. Conversely, an insulating isolation layer 212 may be formed to expand to a source region instead of the drain region.

As shown in FIG. 3B, since the insulating isolation layer 212 may expand to the drain region, the drain region may not be provided, so that a second storage layer cannot be formed. Accordingly, since a memory cell includes only a first storage layer 296 serving as a storage layer, the memory cell may be capable of storing one bit.

Figure 4B:
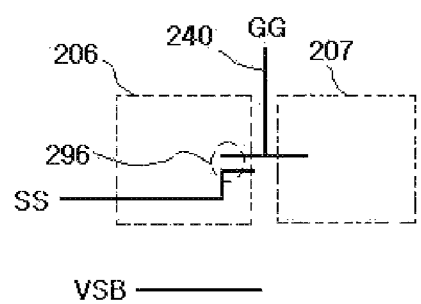
FIG. 4B is a circuit diagram of a memory cell according to another embodiment of the inventive concept.

FIG. 4B is circuit diagram of the memory cell shown in FIG. 3B, according to another embodiment of the inventive concept. As compared with FIG. 4A, FIG. 4B shows a case in which the second bit cell 207 is omitted from the memory cell 250 shown in FIG. 4A.

Figure 3C:
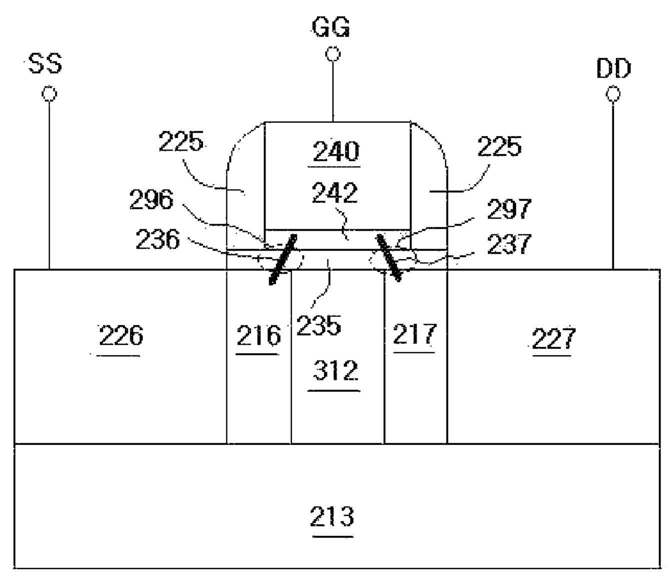
FIG. 3C is a cross-sectional view of a memory cell according to another embodiment of the inventive concept.
Figure 3D:
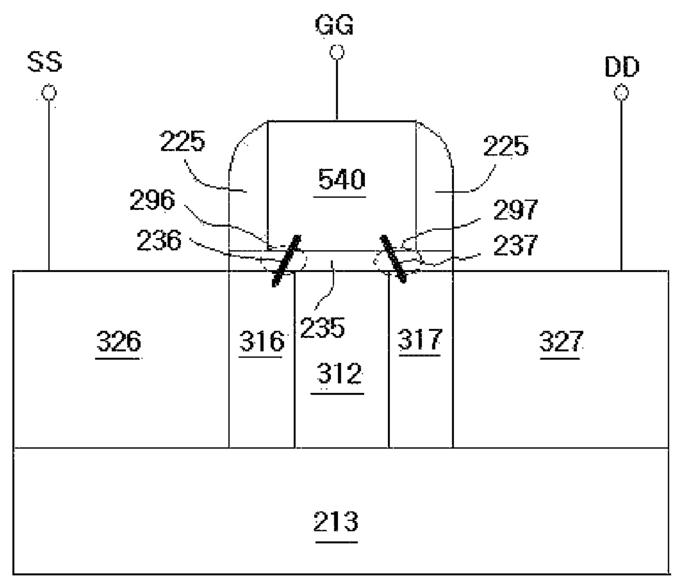
FIG. 3D is a cross-sectional view of a memory cell according to another embodiment of the inventive concept.

FIGS. 3C and 3D are cross-sectional views of memory cells according to other embodiments of the inventive concept, which are formed on a semiconductor substrate including a silicon thin layer formed on an insulating layer (typically known as a silicon-on-insulator (SOW instead of a bulk silicon wafer.

Although FIGS. 3C and 3D illustrate the memory cells formed on a semiconductor substrate including a SOI instead of a semiconductor substrate including a bulk silicon wafer, the inventive concept is not limited to the semiconductor substrate including the SOI.

As shown in FIG. 3C, a buried oxide layer 213 may be formed as an under layer, and a first source region 216, a second source region 226, an insulating isolation layer 312, a first drain region 217, and a second drain region 227 may be formed on the buried oxide layer 213.

A metal layer 242 and a conductive layer 240 may be sequentially stacked on a gate insulating layer 235 and form a gate. Sidewall spacers 225 may be formed on sidewalls of the gate.

The metal layer 242 may be disposed in a lower portion of the gate. When the gate insulating layer 235 (i.e., a first storage layer 296 or a second storage layer 297) is in an electrical conduction state, the metal layer 242 may be converted into a Schottky diode.

As shown in FIG. 3C, the first source region 216 and the first drain region 217 may be lightly doped similarly to those of FIG. 3A. Thus, when the gate insulating layer 235 (i.e., the first storage layer 296 or the second storage layer 297) is in an electrical conduction state, the first source and drain regions 216 and 217 may form Schottky diodes along with the metal layer 242 corresponding to the lower portion of the gate. Accordingly, the memory cell 254 shown in FIG. 3C may have a structure and serve a similar function to the memory cell 250 shown in FIG. 3A.

Figure 4C:
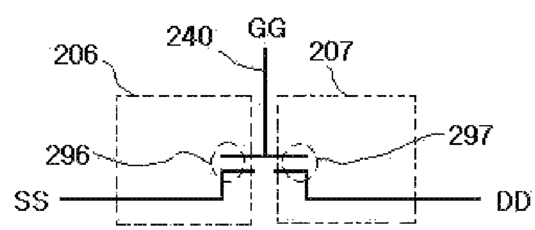
FIG. 4C is a circuit diagram of a memory cell according to another embodiment of the inventive concept.

FIG. 4C is a circuit diagram of the memory cell shown in FIG. 3C. The memory cell of FIG. 4C is similar to that of FIG. 4A except that a semiconductor substrate electrode (VSB) is not provided. This is because a body that will function as the semiconductor substrate electrode VSB may be filled with an insulating isolation layer 312 and surrounded with a buried oxide layer 213 as shown in FIG. 3C.

The memory cell of FIG. 3D is similar to that of FIG. 3C except that first and second source regions 316 and 326 form a diode structure and first and second drain regions 317 and 327 form a diode structure.

Referring to FIG. 3D, according to an embodiment of the inventive concept, the first source region 316 and the second source region 326 may be formed of a semiconductor and a metal, respectively, and form a Schottky diode. That is, the first source region 316 may be formed of a semiconductor lightly doped with a dopant, and the second source region 326 may be formed of silicide. Conversely, the first and second source regions 316 and 326 may be formed of a metal and a semiconductor, respectively, and form a Schottky diode.

Similarly, the first drain region 317 and the second drain region 327 may be formed of a semiconductor and a metal, respectively, and form a Schottky diode. That is, the first drain region 317 may be formed of a semiconductor lightly doped with a dopant, and the second drain region 327 may be formed of silicide. Conversely, the first and second drain regions 317 and 327 may be formed of a metal and a semiconductor, respectively, and form a Schottky diode.

To form the Schottky diode, the metal may be replaced by silicide or a metal compound.

Furthermore, in another embodiment of the inventive concept, a first source region 316, a second source region 326, a first drain region 317, and a second drain region 327 may be formed of a semiconductor lightly doped with a dopant, a source electrode SS and a drain electrode DD connected to a second source region and a second drain region may be formed of silicide or a metal, and Schottky diode structures may be formed.

The formation of the diode structure according to the present invention is not limited to the above description.

In an embodiment of the inventive concept, the first source region 316 and the second source region 326 may be formed of, for example, an N-type semiconductor and a P-type semiconductor, respectively, and constitute a PN junction diode structure. Conversely, the first and second source regions 316 and 326 may be formed of a P-type dopant and an N-type dopant, respectively, and constitute a PN junction diode structure.

Similarly, in an embodiment of the inventive concept, the first drain region 317 and the second drain region 327 may be formed of an N-type semiconductor and a P-type semiconductor, respectively, and constitute a PN junction diode structure. Conversely, the first and second drain regions 317 and 327 may be formed of a P-type semiconductor and an N-type semiconductor, respectively, and constitute a PN junction diode structure.

Referring to FIG. 3D, the gate 540 may include a conductive layer formed of a metal, a silicide, a metal compound, or polycrystalline silicon (poly-Si). Like a typical transistor, the gate 540 may include a conductive layer formed of poly-Si.

The memory cell of FIG. 3D may include a structure in which a region having an insulating isolation layer includes a channel region so that both a source region and a drain region are provided. In another embodiment, the memory cell of FIG. 3D may include a structure in which a region having the insulating isolation layer includes a channel region and any one of a source region and a drain region so that any one of the source and drain regions is not provided as shown in the memory cell of FIG. 3B.

Since the above-described modified embodiments may be easily understood by one skilled in the art, a detailed description thereof will be omitted here. However, the present inventive concept should be interpreted as including various modified embodiments.

Figure 4D:
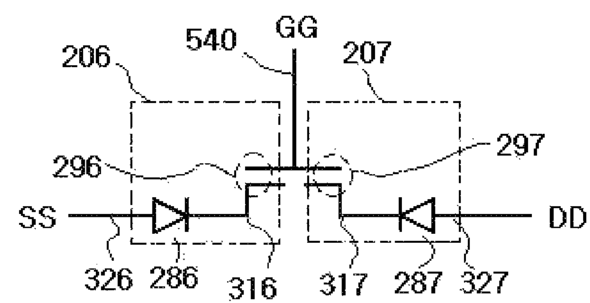
FIG. 4D is a circuit diagram of a memory cell according to another embodiment of the inventive concept.

FIG. 4D is a circuit diagram of the memory cell shown in FIG. 3D, according to an embodiment of the inventive concept. As shown in FIG. 4D, a first diode 286 may be connected between a source electrode SS and a first source region 316, and a second diode 287 may be connected between a drain electrode DD and a first drain region 317.

Figure 3E:
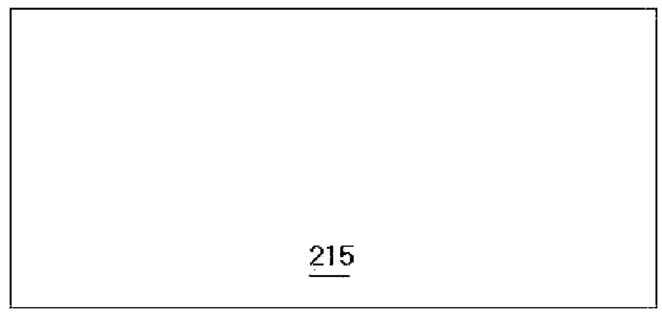
FIG. 3E is a cross-sectional view illustrating preparation of a semiconductor substrate to fabricate a memory cell according to an embodiment of the inventive concept.
Figure 3F:
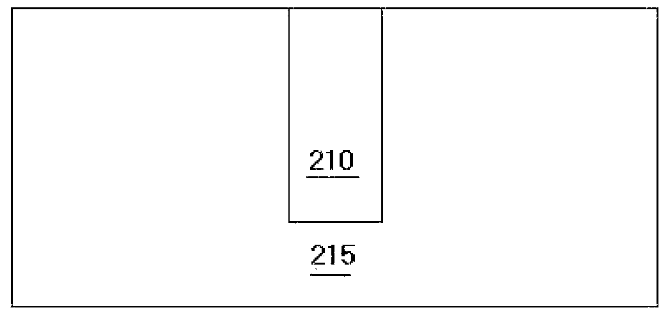
FIG. 3F is a cross-sectional view illustrating formation of an insulating isolation layer to fabricate a memory cell according to an embodiment of the inventive concept.
Figure 3G:
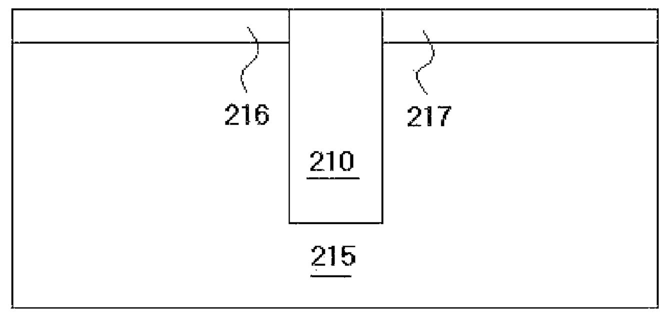
FIG. 3G is a cross-sectional view illustrating formation of a first source region and a second drain region to fabricate a memory cell according to an embodiment of the inventive concept.
Figure 3H:
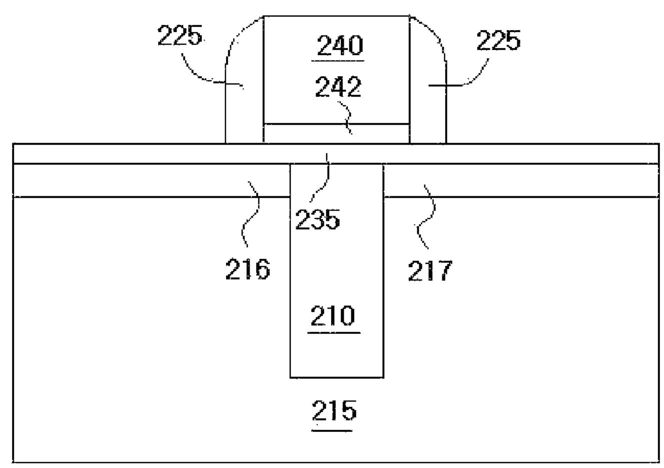
FIG. 3H is a cross-sectional view illustrating formation of a gate insulating layer, a gate, and sidewall spacers to fabricate a memory cell according to an embodiment of the inventive concept.
Figure 3I:
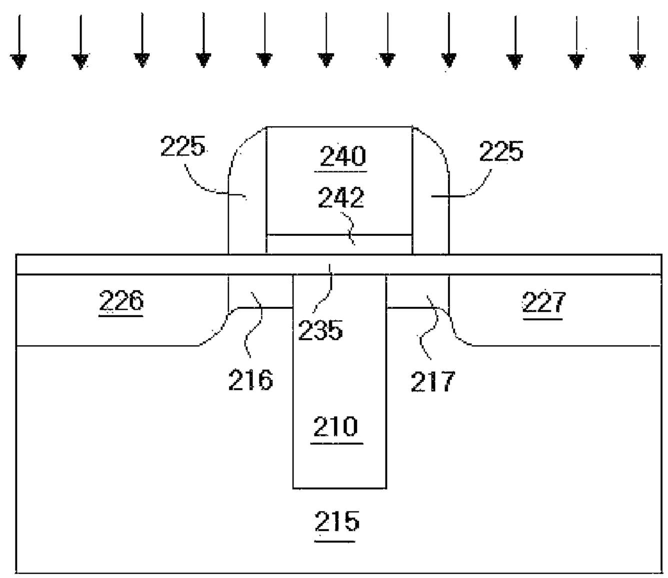
FIG. 3I is a cross-sectional view illustrating formation of a second source region and a second drain region to fabricate a memory cell according to an embodiment of the inventive concept.
Figure 3J:
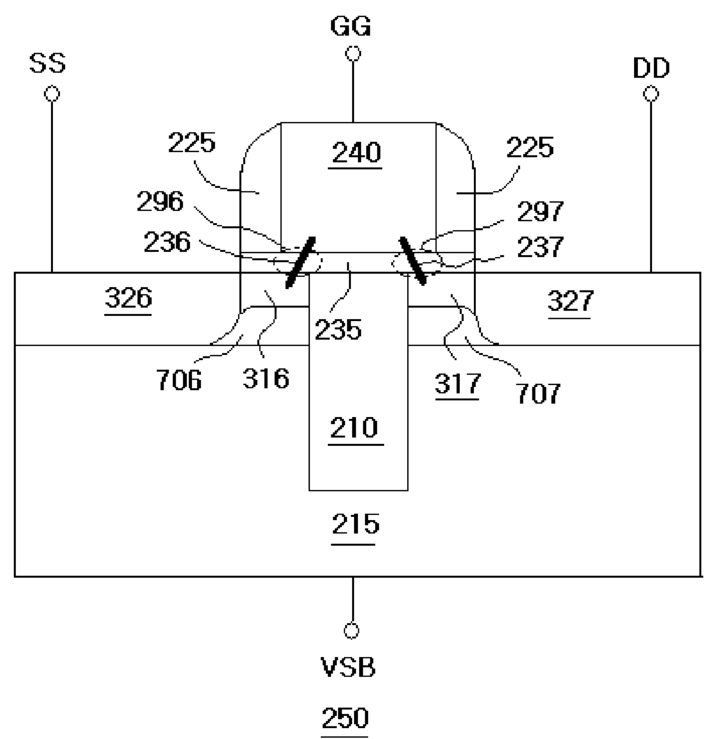
FIG. 3J is a cross-sectional view of a memory cell according to another embodiment of the inventive concept.

FIG. 3J is a cross-sectional view of a memory cell according to an embodiment of the inventive concept. The memory cell of FIG. 3J may have a similar structure to that of FIG. 3D except that the memory cell is formed on a semiconductor substrate including a bulk silicon wafer instead of a semiconductor substrate including a silicon thin layer (SOB.

Referring to FIG. 3J, similarly to the structure of FIG. 3D, a first source region 316 and a second source region 326 may constitute a diode structure, and a first drain region 317 and a second drain region 327 may constitute a diode structure. However, unlike the structure of FIG. 3D, a third source region 706 and a third drain region 707 may be further formed.

In FIG. 3J, each of the diode structures may include a PN diode like in FIG. 3D. In addition, each of the diode structures of FIG. 3J may include a Schottky diode or a material having diode characteristics. Since the diode structures of FIG. 3J are the same as described with reference to FIG. 3D, a repeated description thereof will be omitted.

As shown in FIG. 3J, the third source region 706 may be formed of a semiconductor of the same type as the second source region 326, for example, an N-type semiconductor or a P-type semiconductor, between a semiconductor substrate 215 and the first source region 316. Accordingly, the first source region 316 may be spaced apart from the semiconductor substrate 215 by the third source region 706, the second source region 326, and an insulating isolation layer 210.

Furthermore, as shown in FIG. 3J, the third drain region 707 may be formed of a semiconductor of the same type as the second drain region 327, for example, an N-type semiconductor or a P-type semiconductor, between the semiconductor substrate 215 and the first drain region 317. Accordingly, the first drain region 316 may be spaced apart from the semiconductor substrate 215 by the third drain region 707, the second drain region 327, and the insulating isolation layer 210.

When the semiconductor substrate 210 is an N type, the second source and drain regions 326 and 327 may be implanted with a P-type dopant, the third source and drain regions 706 and 707 may be implanted with a P-type dopant, and the first source and drain regions 316 and 317 may be implanted with an N-type dopant.

FIG. 4D is a circuit diagram of the memory cell shown in FIG. 3J. As shown in FIG. 4D, a first diode 286 may be connected between a source electrode SS and the first source region 316, and a second diode 287 may be connected between a drain electrode DD and the first drain region 317.

A method of fabricating a nonvolatile memory device according to the inventive concept may include preparing a semiconductor substrate, forming an insulating isolation layer in the semiconductor substrate, implanting a dopant complementary to the semiconductor substrate at a low concentration to form a first source region and a first drain region, stacking a gate insulating layer on the semiconductor substrate, forming a gate including a metal layer and a conductive layer, forming sidewall spacers on sidewalls of the gate, and implanting a dopant complementary to the semiconductor substrate at a high concentration to form a second source region and a second drain region.

A method of fabricating a nonvolatile memory device according to another embodiment of the inventive concept may include preparing a semiconductor substrate, forming an insulating isolation layer in the semiconductor substrate, implanting a complementary dopant to the semiconductor substrate to form a third source region and a third drain region, implanting a complementary dopant to the semiconductor substrate into the third source region and the third drain region to form a first source region and a first drain region, stacking a gate insulating layer on the semiconductor substrate, forming a gate including a conductive layer, forming sidewall spacers on sidewalls of the gate, and implanting a complementary dopant to the semiconductor substrate to form a second source region and a second drain region.

Various process operations for fabricating typical MOS transistors are widely known. Accordingly, conventional process operations will be briefly described for clarity, or some known processes will be wholly omitted.

A method of fabricating a memory cell according to an embodiment of the inventive concept is illustrated in FIGS. 3E through 3I.

The method of fabricating the memory cell according to the embodiment of the inventive concept may start from an operation of preparing a semiconductor substrate 215 as shown in FIG. 3E.

The semiconductor substrate 215 may be a single crystalline silicon substrate. Although the present embodiment pertains to an example in which a bulk silicon wafer is used, the inventive concept is not limited thereto.

The semiconductor substrate 215 may be a P-type substrate doped with a P-type dopant or an N-type substrate doped with an N-type dopant. In the present embodiment, it is assumed that the semiconductor substrate 215 is the P-type substrate doped with the P-type dopant.

Thereafter, referring to FIG. 3F, an insulating isolation layer 210 may be formed. The insulating isolation layer 210 may be formed using a typical shallow trench isolation (STI) technique. In this case, the insulating isolation layer 210 may be formed without forming an additional mask.

The formation of the insulating isolation layer 210 may include forming trenches by etching the surface of the semiconductor substrate 215 and filling the trenches with an insulating material. After filling the trenches with the insulating material, the resultant structure may be planarized using, for example, a chemical mechanical polishing (CMP) process.

Thereafter, as shown in FIG. 3G, a first source region 216 and a first drain region 217 may be formed. As described above, the first source and drain regions 216 and 217 may be formed using a dopant that is complementary to the semiconductor substrate 215. When a gate insulating layer 235 is in an electrical conduction path, the first source and drain regions 216 and 217 may be converted into Schottky diodes along with a gate. Therefore, each of the first source and drain regions 216 and 217 should include a lightly doped semiconductor.

Accordingly, an N-type dopant may be implanted at a low concentration into the first source and drain regions 216 and 217 in the arrow direction shown in FIG. 3G.

The first source and drain regions 216 and 217 may be ion-implanted in a self-aligned manner by the insulating isolation layer 210. This is because the insulating isolation layer 210 may serve as an ion implantation mask.

The first source and drain regions 216 and 217 may be formed before forming the gate. However, the inventive concept is not limited thereto. For example, like a typical lightly doped drain (LDD) structure, the first source and drain regions 216 and 217 may be formed after forming the gate.

Thereafter, referring to FIG. 3H, the gate insulating layer 235 may be stacked, and a gate including a metal layer 242 and a conductive layer 240 stacked on the metal layer 242 may be formed on the gate insulating layer 235, and sidewall spacers 225 may be formed on sidewalls of the gate. Although the present embodiment pertains to an example in which the sidewall spacers 225 are formed, the inventive concept is not limited thereto and may be applied to a modified example in which sidewall spacers are not formed.

In an embodiment of the inventive concept, the gate insulating layer 235 may be formed using a gate oxide layer, and the conductive layer 240 may be formed of poly-Si.

The gate oxide layer may be formed by growing a thermal oxide layer on the surface of the semiconductor substrate 215 or depositing an oxide layer.

The gate oxide layer may have a thickness of about 1 nm to about 10 nm. The thickness of the gate oxide layer may be as thin as possible to reduce a voltage (VPP) for a program operation.

In another embodiment, the gate insulating layer 235 may be formed using a variable resistor.

The gate insulating layer 235 may be formed by stacking the variable resistor on the surface of the semiconductor substrate 215 to a predetermined thickness instead of an oxide layer. The variable resistor may be a compound layer formed by stacking various materials.

The variable resistor may be a resistance variable material, a phase transition material, or another material having memory characteristics capable of two stable resistance states.

The resistance variable material may be one of various materials, such as perovskite, a transition metal oxide, or a chalcogenide. The resistance variable material may be a material whose electrical resistance is changed into a low resistance state or a high resistance state due to a predetermined voltage. The resistance variable material may be any one of a binary transition metal oxide and a tertiary transition metal oxide or a combination thereof. The binary transition metal oxide may be $TiO_2$, NiO, $HfO_2$, $Al_2O_3$, $ZrO_2$, ZnO, $Ta_2O_5$, or $Nb_2O_5$, and the tertiary transition metal oxide may be $SrTiO_3$, HfAlO, HfSiO, or HfTiO.

Furthermore, the resistance variable material may be any one of copper (Cu)-doped $SiO_2$, silver (Ag)-doped $SiO_2$, a Cu-doped germanium-selenium-tellurium (Ge—Se—Te) compound, a Ag-doped Ge—Se—Te compound, and a $CuO_x$-based resistance variable material or a combination thereof.

The phase transition material may be a material that is changed into a crystalline phase or an amorphous phase due to a predetermined current. A chalcogenide-based compound may be used as the phase transition material. The chalcogenide-based material having phase transition characteristics may be a binary compound, a tertiary compound, or a quaternary compound, which includes a combination of at least two of Ge, Te, antimony (Sb), indium (In), Se, and tin (Sn), or the binary, tertiary, or quaternary compound to which bismuth (Bi) is added. The phase transition material may be $Ge_2Sb_2Te_5$, or $Ge_2Sb_2Te_5$ into which any one of nitrogen (N), oxygen (O), $SiO_2$, and $Bi_2O_3$ is doped, or a combination thereof.

Referring to FIG. 3H, the metal layer 242 formed as a lower portion of the gate may be formed on the gate insulating layer 235 and replaced by silicide or another metal compound.

As shown in FIG. 3H, the conductive layer 240 formed as an upper portion of the gate may be deposited using poly-Si on the metal layer 242, and the metal layer 242 and the conductive layer 240 formed of poly-Si may be patterned using etching and photolithography processes.

According to the inventive concept, the metal layer 242 may not be formed as the lower portion of the gate but may form the entire gate.

After the patterning process, heat may be applied in an oxidation atmosphere so that a silicon oxide thin layer (not shown) can be thermally grown on sidewalls of the gate 240 and 242 to form sidewall spacers 225.

Figure 6A:
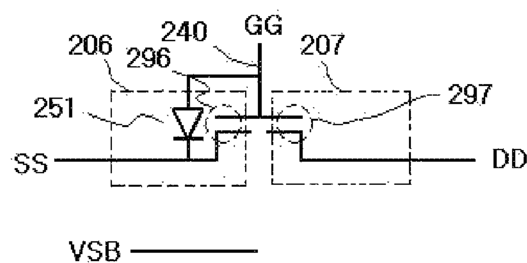
FIG. 6A is an equivalent circuit of a memory cell according to an embodiment of the inventive concept, in which a first bit cell has been programmed.
Figure 6B:
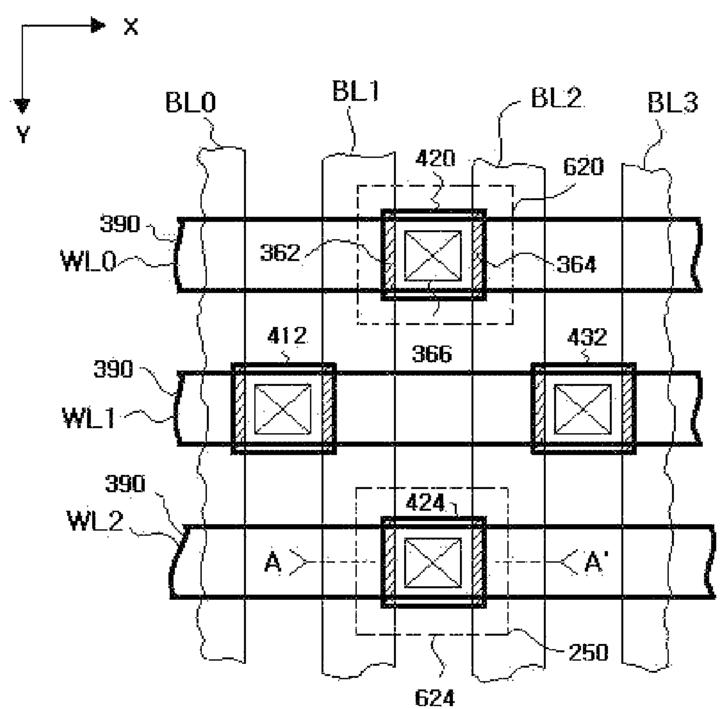
FIG. 6B is a layout of a memory array—A according to an embodiment of the inventive concept.

From a horizontal view, the gate 240 and 242 shown in FIG. 3H may run across the insulating isolation layer 210 and have an island shape like a gate 424 of a memory cell 250 shown in FIG. 6B. As described above, in FIG. 6B, since an insulating isolation layer corresponds to a region other than an active region, the insulating isolation layer may be disposed between bit lines BL1 and BL2.

Thereafter, as shown in FIG. 3I, a dopant may be implanted at a high concentration in the arrow direction to form a second source region 226 and a second drain region 227.

Since the second source and drain regions 226 and 227 should be doped with a dopant that is complementary to the semiconductor substrate 215, an N-type dopant may be ion-implanted into the second source and drain regions 226 and 227 in the present embodiment.

Finally, the fabrication of the memory cell according to the inventive concept may be completed by known process operations (not shown) of, for example, depositing a dielectric material layer, etching openings through the dielectric material layer to expose portions of the second source and drain regions, and forming metalized portions to extend through the openings and be electrically connected to the second source and drain regions.

FIGS. 3K through 3N illustrate a method of fabricating a memory cell according to another embodiment of the inventive concept.

The method of fabricating the memory cell according to another embodiment of the inventive concept may include the processes described above with reference to FIGS. 3E and 3F and will be briefly described to avoid redundancy. As shown in FIG. 3E, the method may begin by preparing a semiconductor substrate 215. Next, an insulating isolation layer 210 may be formed as shown in FIG. 3F.

Figure 3K:
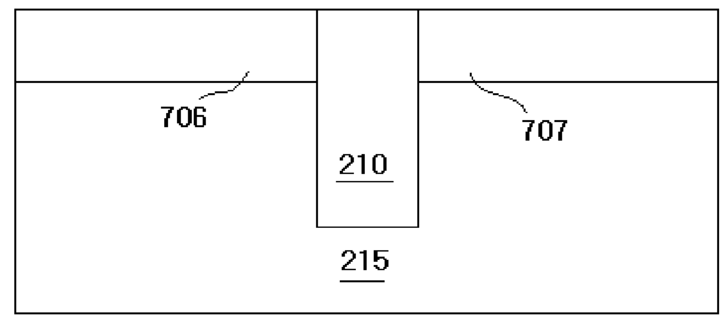
FIG. 3K is a cross-sectional view illustrating formation of a third source region and a third drain region to fabricate a memory cell according to another embodiment of the inventive concept.

Thereafter, referring to FIG. 3K, a third source region 706 and a third drain region 707 may be formed. The third source and drain regions 706 and 707 may include a semiconductor doped with a complementary dopant to the semiconductor substrate 215. The third source and drain regions 706 and 707 may be implanted with ions to have about 1 to 1.5 times the depth of a second source region and a second drain region to be subsequently formed. For example, when the second source and drain regions have a depth of about 0.2 μm, the third source and drain regions 306 and 307 may have a depth of about 0.2 μm to about 0.3 μm.

As a result, the third source and drain regions 706 and 707 and the second source and drain regions may be formed to surround a first source region and a second drain region to be subsequently formed.

Figure 3L:
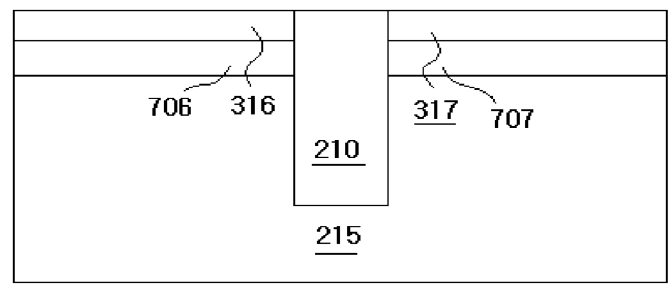
FIG. 3L is a cross-sectional view illustrating formation of a first source region and a first drain region to fabricate a memory cell according to another embodiment of the inventive concept.

Thereafter, as shown in FIG. 3L, a first source region 316 and a first drain region 317 may be formed. The first and second drain regions 316 and 317 may include a semiconductor doped with a complementary dopant to the third source and drain regions 706 and 707. The first source and drain regions 316 and 317 may be implanted with ions to have about half the depth of the second source and drain regions to be subsequently formed. For example, when the second source and drain regions have a depth of about 0.2 μm, the first source and drain regions 316 and 317 may have a depth of about 0.1 μm. As described above, the inventive concept is characterized in that the first source and drain regions 316 and 317 may be implanted with ions in a self-aligned manner by the insulating isolation layer 210. This is because the insulating isolation layer 210 serves as an ion implantation mask.

Figure 3M:
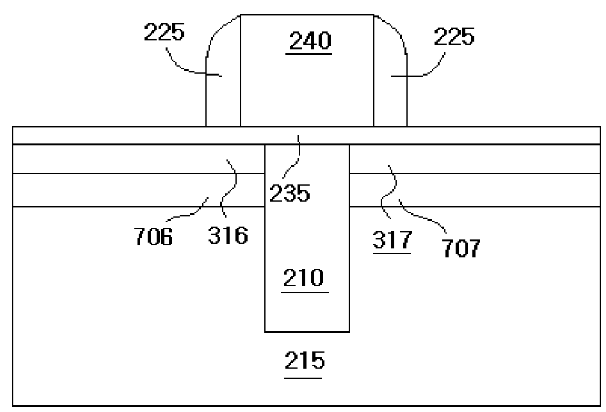
FIG. 3M is a cross-sectional view illustrating formation of a gate insulating layer, a gate, and sidewall spacers to fabricate a memory cell according to another embodiment of the inventive concept.

Thereafter, as shown in FIG. 3M, a gate insulating layer 235 may be stacked on the resultant structure, a gate 240 including a conductive layer may be formed, and sidewall spacers 225 may be formed on sidewalls of the gate 240.

As described above, in another embodiment of the inventive concept, the gate insulating layer 235 may be replaced by a variable resistor.

The variable resistor may be stacked to a predetermined thickness on the surface of the semiconductor substrate 215 instead of an oxide layer serving as the gate insulating layer 235. The variable resistor may have a multilayered structure formed by stacking various materials.

Figure 3N:
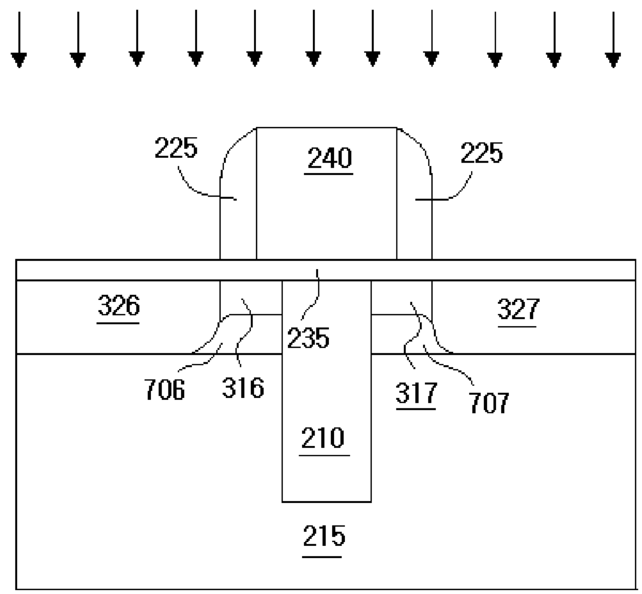
FIG. 3N is a cross-sectional view illustrating formation of a second source region and a second drain region to fabricate a memory cell according to an embodiment of the inventive concept.

Thereafter, as shown in FIG. 3N, a second source region 326 and a second drain region 327 may be formed by implanting a dopant at a high concentration in the arrow direction.

The second source and drain regions 326 and 327 may be implanted with a complementary dopant to the semiconductor substrate 215.

As described above, the fabrication of the memory cell according to the inventive concept may be completed by known process operations (not shown) of, for example, depositing a dielectric material layer, etching openings through the dielectric material layer to expose portions of the second source and drain regions, and forming metalized portions to extend through the openings and be electrically connected to the second source and drain regions.

FIG. 5A is an equivalent circuit diagram of the memory cells shown in FIGS. 3A and 3C, according to an embodiment of the inventive concept, and FIG. 5B is an equivalent circuit diagram of the memory cell shown in FIG. 3D. An equivalent circuit of the memory cell shown in FIG. 3B is omitted because it would be easily understood with reference to FIGS. 3A and 5A.

FIGS. 5A and 5B show a pre-program state in which the gate insulating layer 235 is in an insulation state. FIGS. 5A and 5B are simplified equivalent circuit diagrams showing a case in which the first and second storage layers 296 and 297 of the gate insulating layer 235 are replaced with capacitors 296 and 297.

As compared with FIG. 5A, the first and second diodes 286 and 287 are further illustrated in FIG. 5B.

To enable a program operation of the memory cell according to the inventive concept, a sufficient high voltage may be applied between the gate electrode GG and the source electrode SS or between the gate electrode GG and the drain electrode 217 to form a resistive path in the gate insulating layer 235.

Typically, when the gate insulating layer 235 is an oxide layer, a VCC voltage may be adjusted such that an electric field of about 5 MV/cm is applied to the gate insulating layer 235. Also, to cause a gate breakdown in the gate insulating layer 235 and generate a resistive path, a VCC voltage may be adjusted such that an electric field of about 20 MV/cm is applied to the gate insulating layer 235.

For example, assuming that the gate insulating layer 235 has a thickness of about 2.3 nm in a process using a gate length of about 130 nm, a VCC voltage may be about 1.2 V, and a VPP voltage required for generating a resistive path may be about 5 V.

Accordingly, in the above-described example, a VPP voltage for a program operation may be about 5 V.

Hereinafter, a case in which the gate insulating layer 235 is an insulating layer will be referred to as an A type, and a case in which the gate insulating layer 235 is a variable resistor will be referred to as a B type.

A nonvolatile memory including an A-type memory cell and a method of operating the same may be similar to a nonvolatile memory including a B-type memory cell and a method of operating the same except that, in the A-type memory cell, a gate insulating layer serving as a storage layer cannot be changed from a low resistance state into a high resistance state, unlike a variable resistor. Thus, since the above-described circuit and operation of the memory device including the A-type memory cell according to an embodiment of the inventive concept may be easily applied to a circuit and operation of a memory device including a B-type memory cell, a repeated description will be omitted for brevity.

For example, the above-described VPP voltage, which is a program voltage, may be a voltage required to generate a resistive path in a gate insulating layer and send the gate insulating layer from a high resistance state into a low resistance state.

Similarly, a set voltage may send a variable resistor from a high resistance state into a low resistance state.

Accordingly, the VPP voltage serving as the program voltage may be adjusted to be the set voltage for the variable resistor, and a program operation may be performed in a similar manner to the case in which the memory device includes the A-type memory cell.

Furthermore, the VPP voltage, which is the program voltage, may be adjusted to be a reset voltage and send the variable resistor from a low resistance state into a high resistance state (i.e., a pre-program state).

In a program operation of a memory cell according to an embodiment of the inventive concept, a VPP voltage may be applied to the gate electrode GG, and a VSB may be in a floating state.

When a first bit cell 206 is to be programmed, a voltage of about 0 V may be applied to the source electrode SS, and when a second bit cell 207 is to be programmed, a voltage of about 0 V may be applied to the drain electrode DD.

When the first bit cell 206 is prevented from being programmed during the program operation, the source electrode SS may be in a floating state. When the first bit cell 207 is prevented from being programmed during the program operation, the drain electrode DD may be in a floating state.

Hereinafter, an example in which, in the first bit cell 206, the gate electrode GG has a VPP voltage and a voltage of about 0 V is applied to the source electrode SS will be described.

Since a VPP voltage of about 5 V is applied to the first storage layer 296 between the gate 242 and the first source region 216, a resistive path 236 may be generated so that the first storage layer 296 can be in an electrical conduction state. Thus, the gate 242 and the first source region 216 may form a Schottky diode.

That is, the program operation may be performed so that data '0' can be stored. The resistive path 236 is separately illustrated with solid lines in FIGS. 3A through 3D for clarity.

FIG. 6A is an equivalent circuit diagram of the Schottky diode.

Referring to FIG. 6A, which shows a memory cell 278 after the first bit cell 206 is programmed, a Schottky diode 251 may be formed between the gate electrode GG and the source electrode SS.

In another example, when the gate electrode GG has a VPP voltage and a voltage of about 0 V is applied to the drain electrode DD, since the second bit cell 207 has the same structure as the first bit cell 206, the second bit cell 207 may be programmed like the first bit cell 206. The resistive path 237 generated in the present example is illustrated with a solid line in FIG. 3A for clarity.

During a program operation of the memory cell 250 according to an embodiment of the inventive concept, when the gate electrode GG connected to the gate 242 is selected, a VPP voltage may be applied to the gate electrode GG, and when the gate electrode GG is not selected, the gate electrode GG may be precharged to a voltage of about 0 V and put into a floating state.

When a semiconductor substrate is a P type, a voltage of about 0 V may be applied to a VSB connected to the semiconductor substrate 215. When the semiconductor substrate is an N type, a voltage VCC may be typically applied to the VSB connected to the semiconductor substrate 215.

During a read operation of the memory cell 250, current may flow between the gate electrode GG and the source electrode SS or between the gate electrode GG and the drain electrode DD so that a forward voltage higher than a threshold voltage of a diode can be applied to the diode.

In FIG. 6A, when a VCC voltage corresponding to a power supply voltage is applied to the gate electrode GG and a voltage of about 0 V is applied to the source electrode SS and the drain electrode DD during a read operation, a forward voltage may be applied to the diode 251 due to the resistive path and current may flow through the diode 251.

However, since the second storage layer 297 serves as a capacitor having no resistive path and is put into an insulation state, after the second storage layer 297 is sufficiently charged, current may not flow.

Accordingly, when the flow of current is detected using a read circuit, it may be determined that a resistive path is generated in the first storage layer 296 and no resistive path is generated in the second storage layer 297.

A plurality of memory cells 250 may be arranged in rows and column, form a memory array, and be integrated in a memory device.

As described above, there are two methods for connecting word lines and bit lines in the memory cell 250. In a first method, a gate electrode GG may serve as a word line, each of a source electrode SS and a drain electrode DD may serve as a bit line, and the gate electrode GG may be connected to each of the source and drain electrodes SS and DD. Hereinafter, a memory array formed using the first method will be referred to as a memory array—A.

In a second method, as opposed to the first method, a gate electrode GG may serve as a bit line, each of a source electrode SS and a drain electrode DD may serve as a word line, and the gate electrode GG may be connected to each of the source and drain electrodes SS and DD. Hereinafter, a memory array formed using the second method will be referred to as a memory array—B.

FIG. 6B illustrates the layout of a memory array—A according to an embodiment of the inventive concept.

In FIG. 6B, the layout of the memory cell 250 is separately illustrated with a dotted square.

A cross-sectional view of the memory cell 250, which is taken along line A-A' of FIG. 6B, is the same as in FIG. 3A except for a contact 366 to be connected to a word line WL2 and the word line WL2.

As shown in FIG. 6B, the memory cells 250 may be arranged in a matrix shape. In this case, the memory cells 250 may not be continuously arranged but may be alternately arranged in every other row and in every other column. That is, the memory cells 250 may be disposed in a pattern similar to a check board.

When the memory cells 250 are instead continuously arranged, a bit line may be shared between two memory cells, so that data of the two memory cells may collide in the shared bit line. To prevent this problem, the memory cells 250 may be arranged as shown in FIG. 6B.

Referring to FIG. 6B, word lines WL0, WL1, WL2, . . . may run in an X direction, and bit lines BL0, BL1, BL2, . . . may run in a Y direction. Gates 412, 420, 424, and 432 may include regions in which spaces between the bit lines BL0, BL1, BL2, . . . intersect the word lines WL0, WL1, WL2, . . . .

Each of the bit lines BL0, BL1, BL2, . . . may include an active region serving as a source region or a drain region and the remaining region corresponding to a shallow trench isolation (STI) region.

That is, an STI region may be formed as an insulating isolation layer between two adjacent ones of the bit lines BL0, BL1, BL2, . . . .

As shown in FIG. 6B, regions 362 and 364 in which one gate intersects the source and drain regions corresponding to a portion of the corresponding bit line may be portions of a first source region and a first drain region and are separately striped for clarity.

The inventive concept is characterized in that a second source region or second drain region of a memory cell may run in one direction and be shared with and be directly connected to a second source region or a second drain region of a memory cell arranged in the one direction without passing through a contact.

For example, referring to FIG. 6B, a second source region BL1 and a second drain region BL2 of a memory cell 624 may run in a lengthwise direction and be shared with and be directly connected to a second source region BL1 and a second drain region BL2 of a memory cell 620 adjacent thereto in the lengthwise direction.

Since the second source regions or the second drain regions of adjacent memory cells may be directly connected without passing through a contact, a horizontal area of a memory array may be reduced.

Figure 6C:
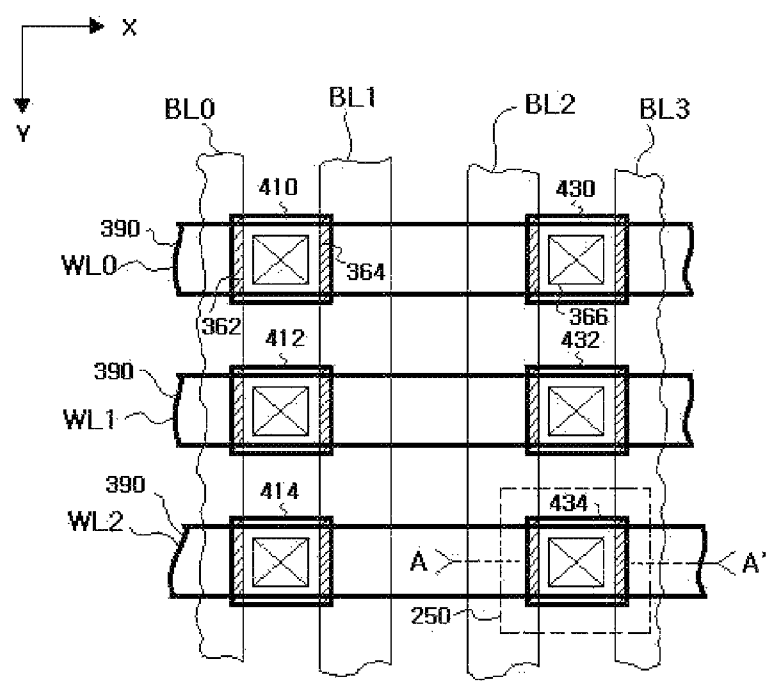
FIG. 6C is a layout of a memory array—A according to another embodiment of the inventive concept.

FIG. 6C illustrates the layout of a memory array—A according to another embodiment of the inventive concept.

In FIG. 6C, the layout of the memory cell 250 is separately illustrated with a dotted square.

A cross-sectional view of the memory cell 250, which is taken along line A-A' of FIG. 6C, is the same as in FIG. 3A except for a contact 366 to be connected to a word line WL2 and the word line WL2.

As shown in FIG. 6C, the memory cells 250 may be arranged in a matrix shape. In this case, the memory cells 250 may be arranged in every row and in every other column The memory cells 250 are arranged as shown in FIG. 6C for the same reason as described above.

Since the layout of the memory array—A of FIG. 6C is similar to that of the memory array—A of FIG. 6B, a repeated description thereof is omitted for brevity.

Figure 6D:
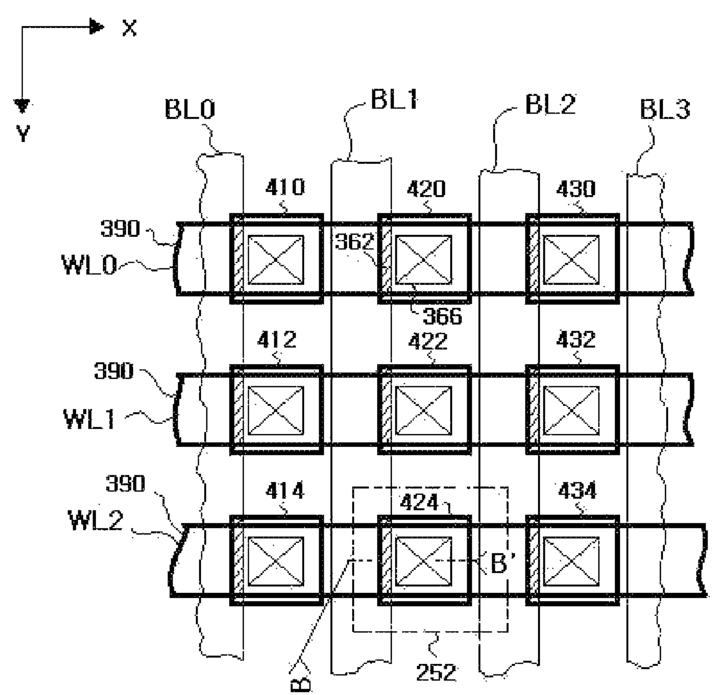
FIG. 6D is a layout of a memory array—A according to another embodiment of the inventive concept.

FIG. 6D illustrates the layout of a memory array—A according to another embodiment of the inventive concept.

In FIG. 6D, the layout of a memory cell 252 is separately illustrated with a dotted square.

A cross-sectional view of the memory cell 252, which is taken along line B-B' of FIG. 6D, is the same as in FIG. 3B except for a contact 366 to be connected to a word line WL2 and the word line WL2.

As shown in FIG. 6D, the memory cells 252 may be arranged in a matrix shape. In this case, one bit line may intersect a gate in each of the memory cells 252 so that each of the memory cells 252 may have one storage region.

Figure 7A:
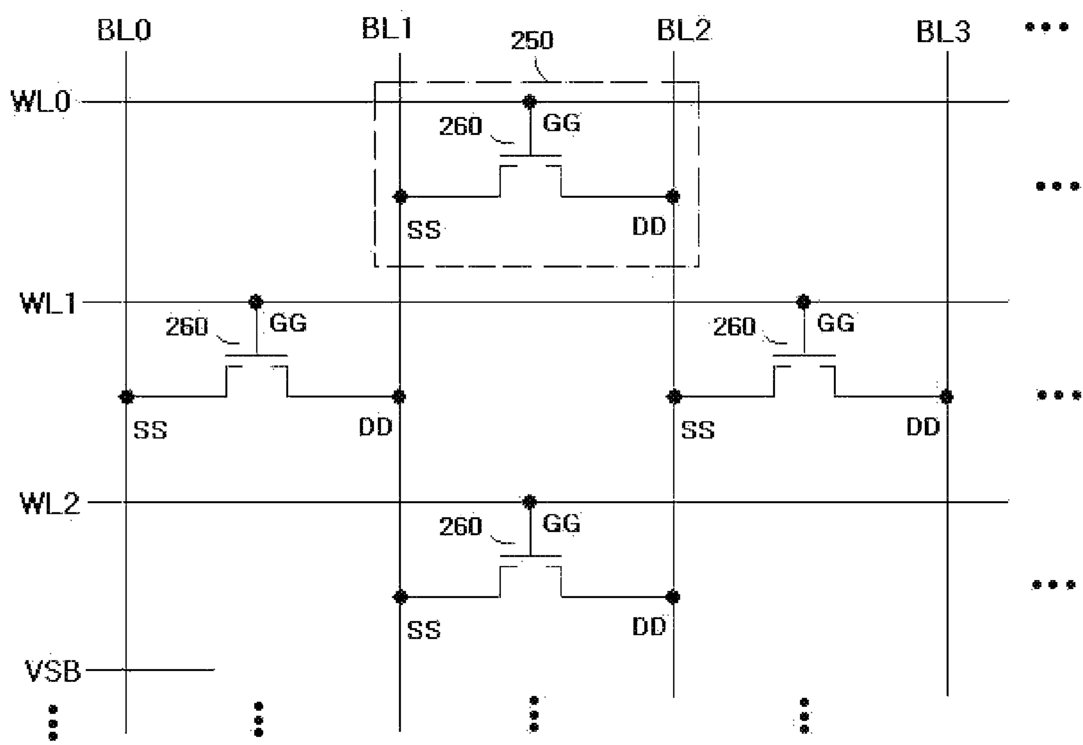
FIG. 7A is a circuit diagram of a memory array—A according to an embodiment of the inventive concept.

FIG. 7A shows a memory array—A according to an embodiment of the inventive concept.

Figure 7B:
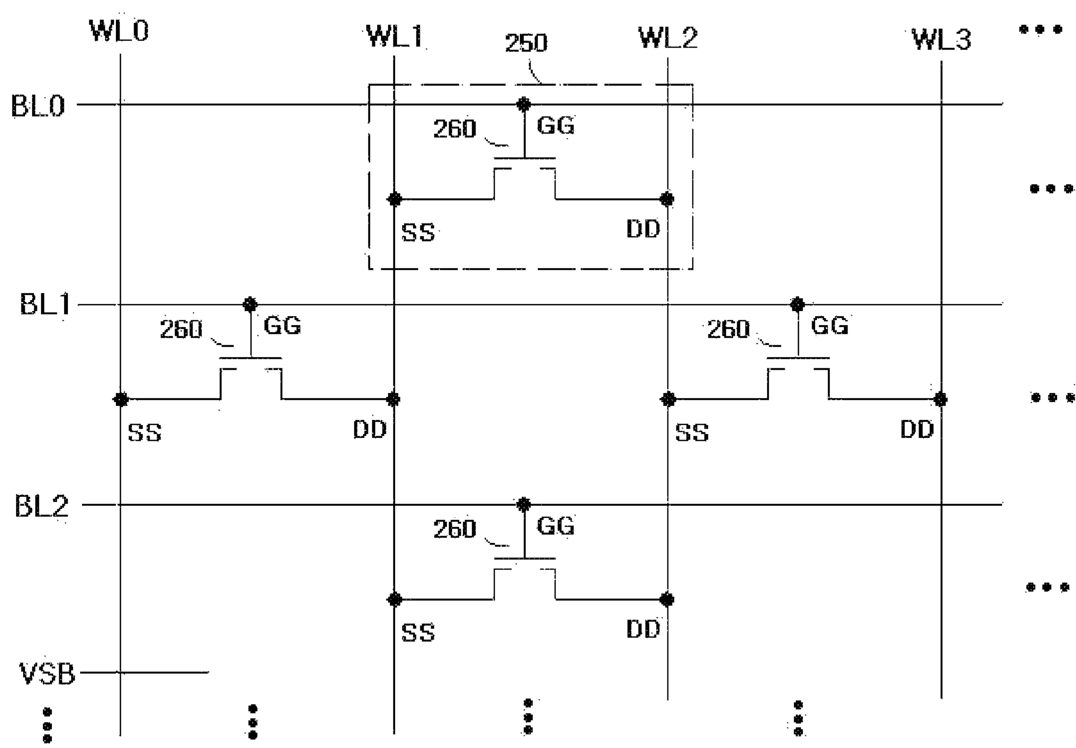
FIG. 7B is a circuit diagram of a memory array—B according to an embodiment of the inventive concept.

FIG. 7B is a circuit diagram of a memory array—B according to an embodiment of the inventive concept.

Referring to FIG. 7A, a memory array—A 140 may include a plurality of memory cells 250 arranged and integrated in a matrix shape.

Referring to FIG. 7B, a memory array—B 142 may include a plurality of memory cells 250 arranged and integrated in a matrix shape.

Referring to FIG. 7A, a source electrode SS and a drain electrode DD of one memory cell 250 may be connected to a source electrode SS and a drain electrode DD of another memory cell. Source electrodes SS and drain electrodes DD of the memory cells 250 may be arranged in columns and form bit line buses BL0, BL1, BL2, . . . .

The bit line buses BL0, BL1, BL2, . . . may be selected by a column decoder and connected to global bit line buses GBL0, GBL1, GBL2, . . . and transmit and receive data to and from a read circuit and a write circuit.

Referring to FIG. 7B, a gate electrode GG of one memory cell 250 may be connected to a gate electrode GG of another memory cell. Gate electrodes GG of the memory cells 250 may be arranged in columns and form bit line buses BL0, BL1, BL2, . . . .

The bit line buses BL0, BL1, BL2, . . . may be selected by a column decoder and connected to global bit line buses GBL0, GBL1, GBL2, . . . and transmit and receive data to and from a read circuit and a write circuit.

During a write operation of the memory array—A according to the inventive concept, the column decoder may include a bit line precharge circuit configured to precharge the global bit lines GBL0 and GBL1 to a VPP voltage. The bit line precharge circuit may include transistors configured to be controlled in response to a write precharge signal WPB.

The global bit lines GBL0 and GBL1 may have a voltage of about 0 V or be put into a floating state under the control of the write circuit and in response to data. Write data input signals WD0 and WD1 may be transmitted via an inverter and through a pull-down transistor and pass transistors so that each of the global bit lines GBL0 and GBL1 can have a voltage of about 0 V to enable a program operation or be in a floating state to prevent the program operation. Thereafter, the write data input signals WD0 and WD1 may be transmitted by the column decoder to selected bit lines BL0 and BL1.

During a write operation of the memory array—B according to the inventive concept, the column decoder may include a bit line precharge circuit configured to precharge global bit lines GBL0 and GBL1 to a voltage of about 0 V.

The bit line precharge circuit may include transistors configured to be controlled in response to a write precharge signal WPB.

The global bit lines GBL0 and GBL1 may have a VPP voltage or may be put into a floating state under the control of the write circuit and in response to data. Write data input signals WD0 and WD1 may be transmitted via a level shifter through a pull-up transistor and pass transistors so that each of the global bit lines GBL0 and GBL1 can have a VPP voltage to enable a program operation or be put into a floating state to prevent the program operation. The global bit lines GBL0 and GBL1 may be transmitted by the column decoder to selected bit lines BL0 and BL1.

Accordingly, data '0' or data '1' may be stored. To store the data '0' or data '1', a logic level '0' or a logic level '1' may be input as write data input signals WD0 and WD1.

In a read operation of the memory array—A according to the inventive concept, a sense amplifier may sense and amplify electrical states of bit lines BL0 and BL1 based on a state of storage of a selected cell transistor and convert the sensed and amplified electrical state into digital data. A read circuit required for the read operation may further include a transistor connected to the global bit lines GBL0 and GBL1 and configured to precharge the global bit lines GBL0 and GBL1 to a voltage of about 0 V and the sense amplifier configured to transmit the electrical state of the bit lines BL0 and BL1 to the global bit lines GBL0 and GBL1 and read stored data.

In a read operation of the memory array—B according to the inventive concept, a sense amplifier may sense and amplify an electrical state of bit lines BL0 and BL1 based on a state of storage of a selected cell transistor and convert the sensed and amplified electrical state into digital data. A read circuit required for the read operation may further include a transistor connected to the global bit lines GBL0 and GBL1 and configured to precharge the global bit lines GBL0 and GBL1 to a voltage VCC and the sense amplifier configured to transmit the electrical state of the bit lines BL0 and BL1 to the global bit lines GBL0 and GBL1 and read stored data.

When an SAE signal is at a logic level '1,' the sense amplifier may begin to operate, amplify a voltage difference between a reference voltage VREF and a voltage of input signals via the global bit lines GBL0 and GBL1, latch the voltage difference, and output a latched value to output terminals RD0 and RD1.

Specifically, referring to FIG. 7A, a gate electrode GG of one memory cell 250 may be connected to a gate electrode GG of another memory cell 250. Gate electrodes GG of the memory cells 250 may be arranged in rows and form word line buses WL0, WL1, WL2, WL3, . . . . The word line buses WL0, WL1, WL2, WL3, . . . may be connected to an output terminal of a row decoder and selected by the row decoder.

Referring to FIG. 7B, a source electrode SS and a drain electrode DD of one memory cell 250 may be connected to a source electrode SS and a drain electrode DD of another memory cell 250. Source and drain electrodes SS and DD of the memory cells 250 may be arranged in rows and form word line buses WL0, WL1, WL2, WL3, . . . . The word line buses WL0, WL1, WL2, WL3, . . . may be connected to an output terminal of a row decoder and selected by the row decoder.

A semiconductor substrate 215 may be a P-well and connected to a VSB.

In the memory array—A 140 and the memory array—B 142 according to the inventive concept, a memory cell may be selected by a word line and a bit line, and data may be stored in a cell transistor constituting the selected memory cell during a program operation.

The memory cell connected to a word line selected by the row decoder and a bit line selected by the column decoder may be programmed according to an electrical state of a bit line selected by the column decoder.

According to an embodiment of the inventive concept, a state in which a gate insulating layer of the cell transistor has no resistive path may be defined as storage of data '1,' and a state in which the gate insulating layer of the cell transistor has a resistive path may be defined as storage of data '0.'

Accordingly, data '1' may be initially stored in cell transistors of all memory cells. To store data '0,' a resistive path should be generated in the gate insulating layer of the selected cell transistor.

Conversely, to store data '1,' even if a cell transistor is selected by a word line and a bit line, a resistive path may be prevented from being generated in a gate insulating layer of the corresponding cell transistor. That is, the memory cell should be prevented from being programmed. To this end, a selected bit line may be in a floating state.

During a program operation performed on the memory array—A according to an embodiment of the inventive concept, when a word line is selected, a VPP voltage may be applied to the selected word line, and the remaining unselected word lines may be precharged to a voltage of about 0 V and put into a floating state.

During a program operation performed on the memory array—B according to an embodiment of the inventive concept, when a word line is selected, a voltage of about 0 V may be applied to the selected word line, and the remaining unselected word lines may be precharged to a VPP voltage and put into a floating state.

A program operation performed on a memory array—A 550 according to an embodiment of the inventive concept will now be described with reference to FIG. 8A.

Figure 8A:
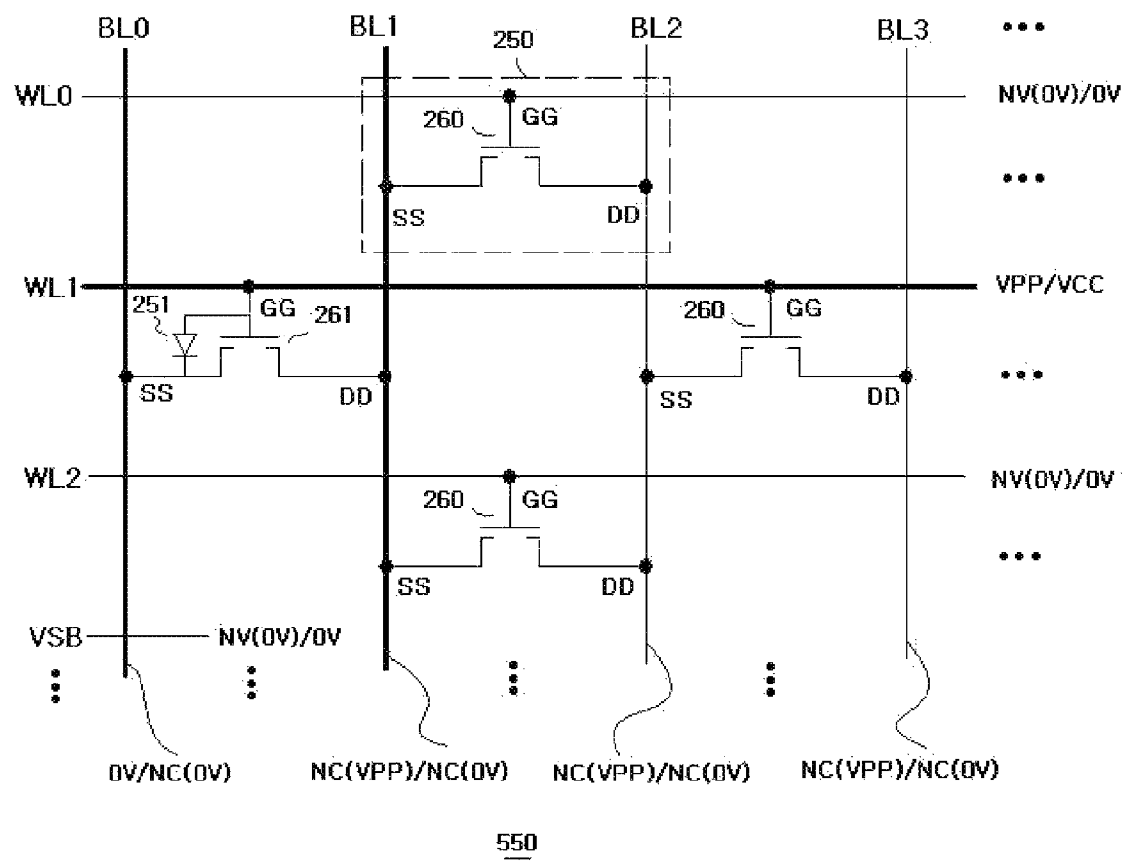
FIG. 8A is a circuit diagram of a memory array—A for explaining program and read operations of a memory array—A according to an embodiment of the inventive concept.

In the present embodiment, it is assumed that a word line WL1 and bit lines BL0 and BL1 are selected as shown in FIG. 8A and illustrated with solid lines for clarity.

In the present embodiment, unselected word lines may remain in a floating state, and a VPP voltage may be applied to the floated selected WL1.

Also, a VSB and unselected bit lines BL2, BL3, . . . may be in a floating state.

In an embodiment of the inventive concept, it is assumed that data '0' may be stored through the bit line BL0 and data '1' may be stored through the bit line BL1.

As described above, a voltage of about 0 V may be applied to the bit line BL0 to store data '0,' and the bit line BL1 may be in a floating state to store data '1.'

In addition, a VPP voltage may be applied to the selected word line WL1, and a voltage of about 0 V may be applied to the bit line BL0.

As a result, the VPP voltage may be applied between the gate electrode GG and the source electrode SS in a cell transistor 261. In the above-described example related with the VPP voltage, a VPP voltage of about 5 V may be applied between the gate electrode GG and the source electrode SS in the cell transistor 261.

Therefore, a resistive path may be generated in a first storage layer between the gate electrode GG and the source electrode SS in the cell transistor 261. That is, data '0' may be programmed. Accordingly, the first storage layer may be in an electrical conduction state and a first diode 251 may be formed.

In contrast, since the bit line BL1 is in a floating state irrespective of the word line WL1, even if the VPP voltage is applied to the word line WL1 connected to the gate electrode GG of the cell transistor 261, a high voltage may not be applied between the gate electrode GG and the drain electrode DD.

Accordingly, a resistive path may not be generated in a second storage layer between the gate electrode GG and the drain electrode DD. That is, a program operation may be prevented. In other words, an initial storage state may be maintained, so that data '1' may be stored.

The selected bit lines BL0 and BL1 may include a column decoder and a write circuit and form a path to which data required for a program operation is input.

A program operation performed on the memory array—B 142 according to an embodiment of the inventive concept will now be described with reference to FIG. 8B.

Figure 8B:
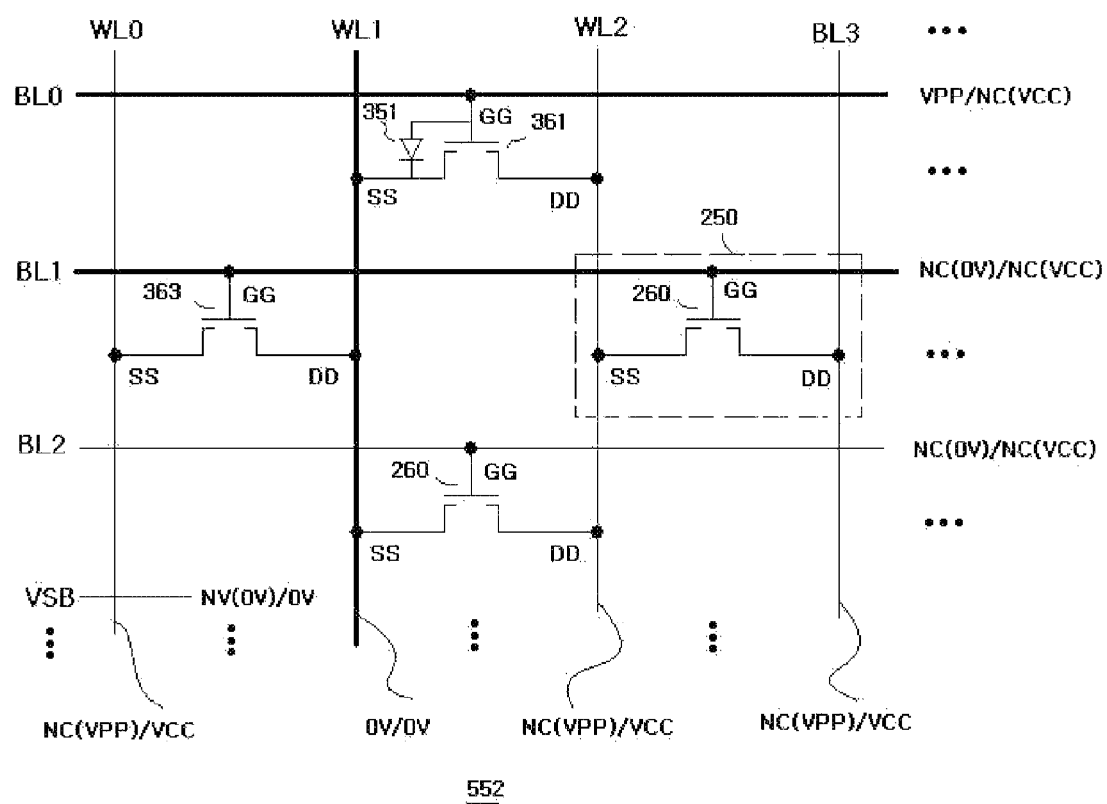
FIG. 8B is a circuit diagram of a memory array—B for explaining program and read operations of a memory array—B according to an embodiment of the inventive concept.

In the present embodiment, it is assumed that a word line WL1 and bit lines BL0 and BL1 are selected as shown in FIG. 8B and illustrated with solid lines for clarity.

In the present embodiment, unselected word lines may remain in a floating state, and a voltage of about 0 V may be applied to the floated selected WL1.

Also, a VSB and unselected bit lines BL2, BL3, . . . may be in a floating state.

In an embodiment of the inventive concept, it is assumed that data '0' is stored through the bit line BL0 and data '1' is stored through the bit line BL1.

As described above, a VPP voltage may be applied to the bit line BL0 to store data '0,' and the bit line BL1 may be in a floating state to store data '1.'

In addition, a voltage of about 0 V may be applied to the selected word line WL1, and a VPP voltage may be applied to the bit line BL0. As a result, a VPP voltage may be applied between the gate electrode GG and the source electrode SS in the cell transistor 361. Therefore, a resistive path may be a first storage layer between the gate electrode GG and the source electrode SS. That is, data '0' may be programmed. Accordingly, the first storage layer may be in an electrical conduction state and a first diode 351 may be formed. Thus, data '0' may be stored.

In contrast, since the bit line BL1 is in a floating state irrespective of the word line WL1, programming may be prevented so that an initial state can be maintained and data '1' can be stored.

Figure 9A:
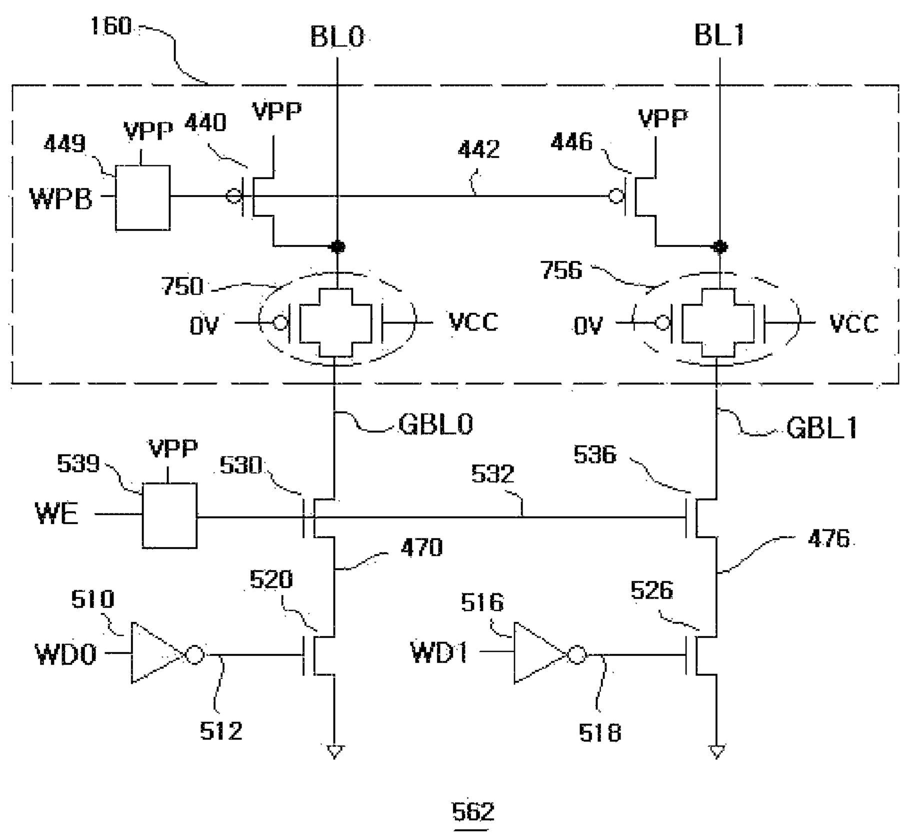
FIG. 9A is a circuit diagram of a partial circuit of a column decoder and a write circuit configured to transmit data to a memory array—A according to an embodiment of the inventive concept.

FIG. 9A illustrates a portion of a column decoder and a write circuit for a memory array—A.

Figure 9B:
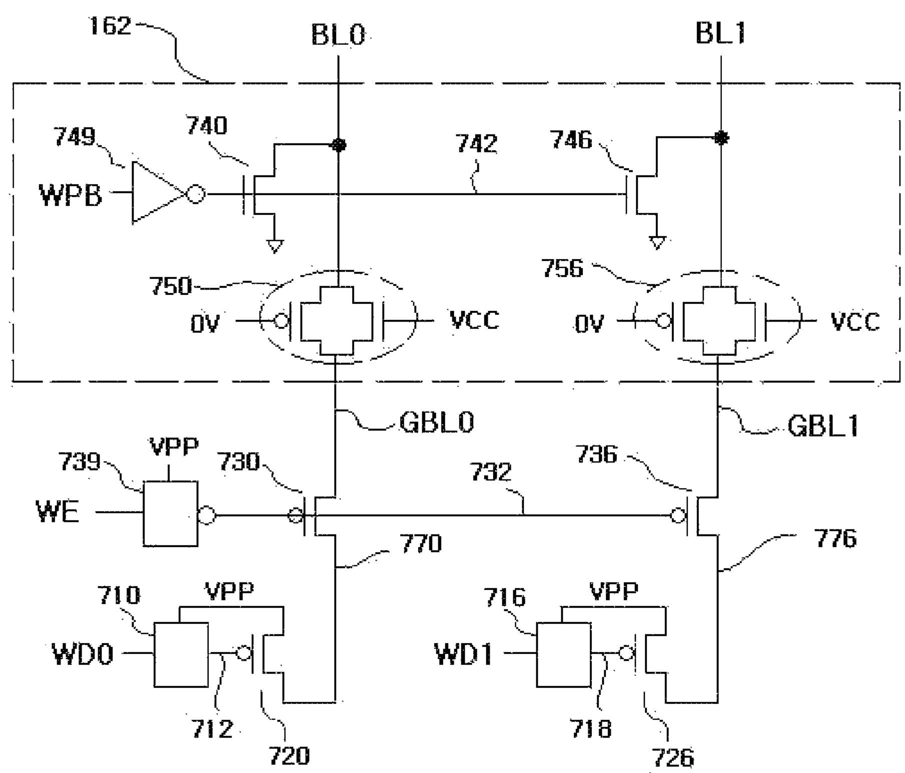
FIG. 9B is a circuit diagram of a partial circuit of a column decoder and a write circuit configured to transmit data to a memory array—B according to an embodiment of the inventive concept.

FIG. 9B illustrates a portion of a column decoder and a write circuit for a memory array—B.

Referring to FIGS. 9A and 9B, in an embodiment of the inventive concept, it is assumed that bit lines BL0 and BL1 and global bit lines GBL0 and GBL1 are selected from column decoders 160 and 162 by transmission gates 750 and 756 that are selected and controlled by column decoding.

Thus, FIGS. 9A and 9B briefly illustrate that channels of the selected transmission gates 750 and 756 are in an electrical conduction state in a condition under which a VCC voltage and a voltage of about 0 V are applied to gates of the transmission gates 750 and 759.

Transistors 440, 446, 740 and 746 may be provided to precharge the bit lines BL0 and BL1 to the VPP voltage in FIG. 9A and precharge the bit lines BL0 and BL1 to the voltage of about 0 V in FIG. 9B. The transistors 440, 446, 740, and 746 may be controlled in response to a WPB.

In FIG. 9A, the global bit lines GBL0 and GBL1 may have a voltage of about 0 V or may be in the floating states under the control of the write circuit and in response to data.

In FIG. 9B, the global bit lines GBL0 and GBL1 may have the VPP voltage or may be in the floating state under the control of the write circuit and in response to data.

As shown in FIG. 9A, write data input signals WD0 and WD1 may be transmitted via inverters 510 and 516 through pull-down transistors 520 and 520 and pass transistors 530 and 536 so that the global bit lines GBL0 and GBL1 can have the voltage of about 0 V to enable a program operation or be in the floating state to prevent the program operation.

As shown in FIG. 9B, write data input signals WD0 and WD1 may be transmitted via level shifters 710 and 716 through pull-up transistors 720 and 726 and pass transistors 730 and 736 so that the global bit lines GBL0 and GBL1 can have the VPP voltage to enable a program operation or be in the floating state to prevent the program operation.

In connection with a process of programming the memory array according to an embodiment of the inventive concept, data '0' may be stored through the bit line BL0, and data '1' may be stored through the bit line BL1.

Accordingly, the write data input signal WD0 may be at a logic level '0,' and the write data input signal WD1 may be at a logic level '1.'

Since a case in which the bit line BL0 or the bit line BL1 is prevented from being programmed is required according to the inventive concept, the floating state may be switched at the VPP voltage in the case shown in FIG. 9A, and may be switched at the voltage of about 0 V in the case shown in FIG. 9B.

Accordingly, since the bit lines BL0 and BL1 should be precharged to the VPP voltage in the case shown in FIG. 9A and should be precharged to the voltage of about 0 V in the case shown in FIG. 9B, before the word line WL1 is selected, the signal WPB may be at a logic level '0' during a write cycle in a program mode.

Figure 10A:
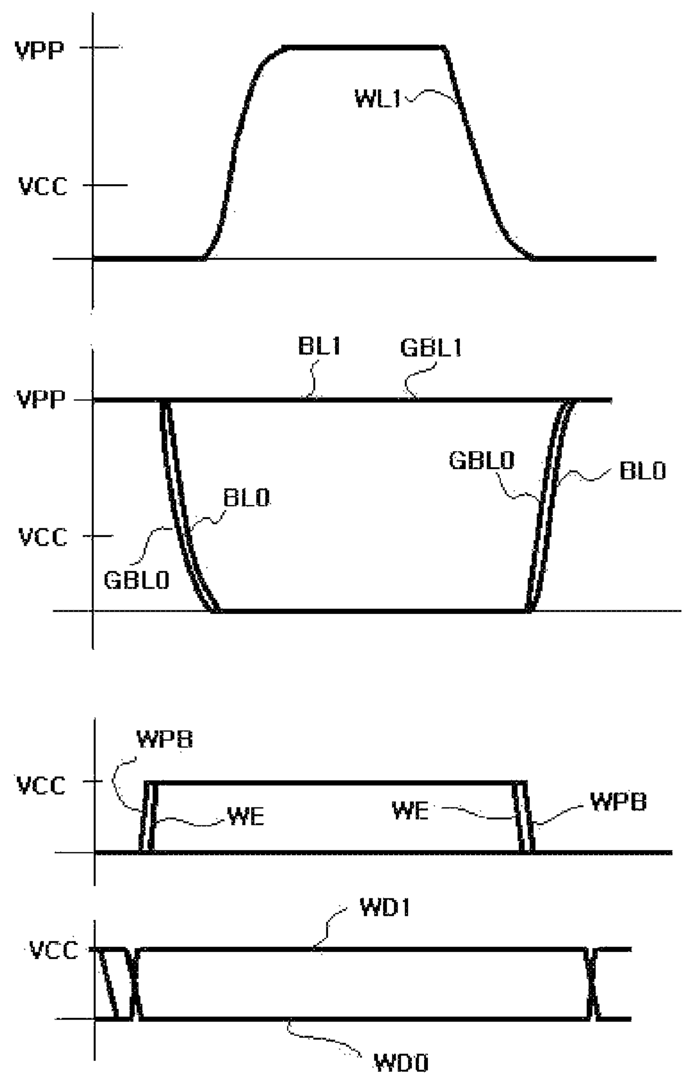
FIG. 10A is a timing diagram showing programming of data in an A-type memory device according to an embodiment of the inventive concept.
Figure 10B:
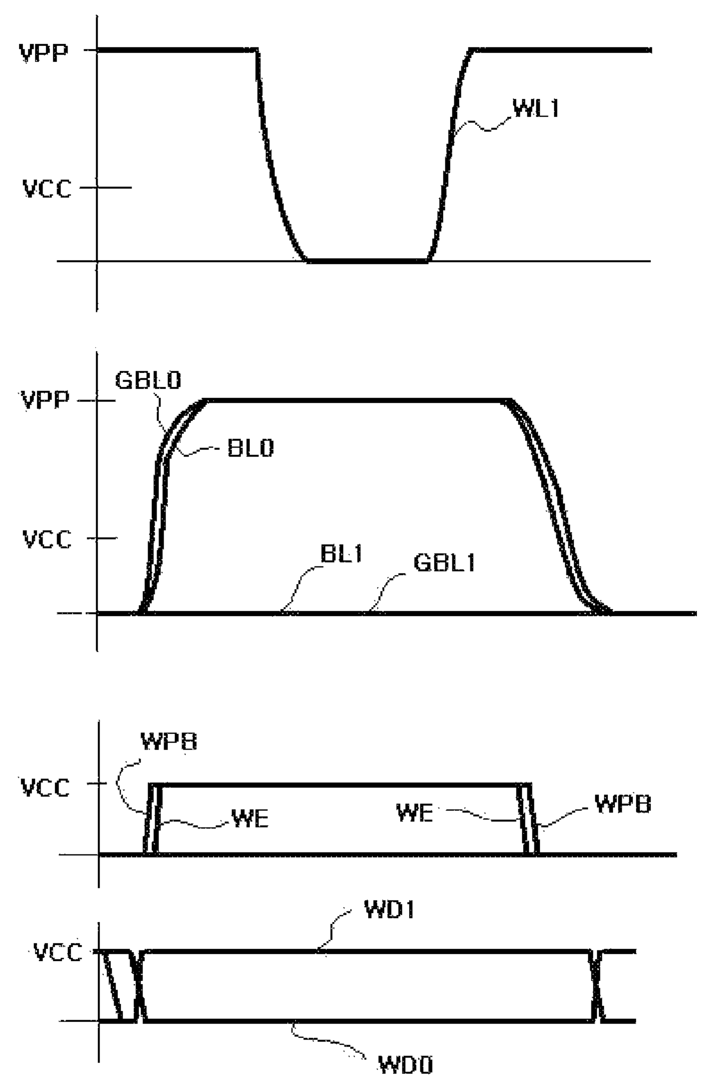
FIG. 10B is a timing diagram showing programming of data in a B-type memory device according to an embodiment of the inventive concept.

FIG. 10A is a timing diagram 570 showing a write cycle of the memory array—A, and FIG. 10B is a timing diagram 572 showing a write cycle of the memory array—B.

Since the write data input signal WD0 is at the logic level '0,' in the case shown in FIG. 9A, the write data input signal WD0 may be transmitted via the inverter 510 so that a gate 512 of the pull-down transistor 520 can have a VCC voltage and a drain 470 can have a voltage of about 0 V. Also, in the case shown in FIG. 9B, the write data input signal WL0 may be transmitted via the level shifter 710 so that a gate 712 of the pull-up transistor 720 has a voltage of about 0 V and a drain 770 has a VPP voltage.

Furthermore, since the write data input signal WD1 is at the logic level '1,' in the case shown in FIG. 9B, the write data input signal WD1 may be transmitted via the inverter 516 so that a gate 518 of the pull-down transistor 526 can have a voltage of about 0 V and a drain 476 can be in a floating state. In the case shown in FIG. 9B, the write data input signal WD1 may be transmitted via the level shifter 716 so that a gate 718 of the pull-up transistor 776 can have the VPP voltage and a drain 776 can be in a floating sate.

Thereafter, the write precharge signal WPB may be at a logic level '1' as shown in FIGS. 10A and 10B. Thus, in the case shown in FIG. 9A, the write precharge signal WPB may be transmitted through a level shifter 449, and a gate 442 of bit line precharge transistors 440 and 446 may have a VPP voltage so that precharging of the bit lines BL0 and BL1 can be finished. Similarly, in the case shown in FIG. 9B, the write precharge signal WPB may be transmitted via an inverter 749, and a gate 742 of bit line precharge transistors 740 and 746 may have a voltage of about 0 V so that precharging of the bit lines BL0 and BL1 can be finished.

Immediately after the precharging of the bit lines BL0 and BL1 is finished, a signal WE may be at a logic level '1'.

As shown in FIGS. 10A and 10B, the signal WE may be at the logic level '1.' Thus, in the case shown in FIG. 9A, the signal WE may be transmitted via a level shifter 539 so that a gate 532 of the pass transistors 530 and 536 can have a VPP voltage and a channel can be in an electrical conduction state. Thus, the global bit line GBL0 and the bit line BL0 may have a voltage of about 0 V, and the global bit line GBL1 and the bit line BL1 may be in a floating state. Also, in the case shown in FIG. 9B, the signal WE may be transmitted via a level shifter 739 capable of shifting a signal from a logic level to an opposite logic level so that a gate 732 of the pass transistors 730 and 736 can have a voltage of about 0 V and a channel can be in an electrical conduction state. Thus, the global bit lines GBL0 and the bit line BL0 may have a VPP voltage, and the global bit lines GBL1 and the bit line BL1 may be in a floating state.

As shown in FIG. 10A, when the word line WL1 is selected, a VPP voltage may be applied to the word line WL1 and a voltage of about 0 V may be applied to the bit line BL0. In this case, in the cell transistor 261 shown in FIG. 8A, the source electrode SS connected to the bit line BL0 may have a voltage of about 0 V so that a high voltage can be applied to the first storage layer between the gate electrode GG connected to the word line WL1 and the source electrode SS connected to the bit line BL0. Thus, a resistive path may be generated to form the first diode 251. That is, a program operation may be performed so that data '0' can be stored. Also, since the drain electrode DD connected to the bit line BL1 is in a floating state in the cell transistor 261, a resistive path may not be generated in the second storage layer between the gate electrode GG connected to the word line WL1 and the drain electrode DD connected to the bit line BL1. Thus, the program operation may be prevented so that data '1' can be stored.

As shown in FIG. 10B, when the word line WL1 is selected, a voltage of about 0 V may be applied to the word line WL1 and a VPP voltage may be applied to the bit line BL0. In this case, in the cell transistor 361 shown in FIG. 8B, the gate electrode GG connected to the bit line BL0 may have a VPP voltage so that a high voltage can be applied to the high storage layer between the gate electrode GG connected to the bit line BL0 and the source electrode SS connected to the word line WL1. Thus, a resistive path may be generated to form the first diode 351. That is, a program operation may be performed so that data '0' can be stored. Also, since the drain electrode DD connected to the bit line BL1 is in the floating state in the cell transistor 363, a resistive path may not be generated in the second storage layer between the gate electrode GG connected to the bit line BL1 and the drain electrode DD connected to the word line WL1. Thus, the program operation may be prevented so that data '1' can be stored.

Subsequently, as shown in FIG. 10A, the word line WL1 may be precharged to a voltage of about 0 V, the signal WE may be sent to a logic level '0,' and the write precharge signal WPB may be sent to a logic level '0.' Thus, the signal WE and the write precharge signal WPB may be transmitted via the level shifter 449 so that the bit line precharge transistors 440 and 446 can be in an electrical conduction state and the global bit lines GBL0 and GBL1 can be precharged to the VPP voltage again. As a result, a write cycle operation may be finished.

As shown in FIG. 10B, the word line WL1 may be precharged to the VPP voltage, the signal WE may be sent to a logic level '0,' and the write precharge signal WPB may be sent to a logic level '0.' Thus, the signal WE and the write precharge signal WPB may be transmitted via the inverter 749 so that the bit line precharge transistors 740 and 746 can be in an electrical conduction state and the global bit lines GBL0 and GBL1 can be precharged to the voltage of about 0 V again. As a result, a write cycle operation may be finished.

By performing a read cycle operation after the write cycle operation, it may be verified whether or not the program operation is reliably performed. The program operation may be reliably performed by repeating write and read operations, and failures may be processed by limiting the number of times the write and read operations are repeated.

Furthermore, data stored in memory cells may be read by determining the presence and absence of a resistive path. That is, when a storage state of a memory cell selected by a word line is transmitted to a selected bit line, a sense amplifier may sense and amplify an electrical state of the bit line and convert the sensed and amplified electrical state into digital data.

A read operation of the memory arrays 550 and 552 according to an embodiment of the inventive concept will now be described with reference to FIGS. 8A and 8B.

For example, it is assumed in the cell transistor 261 shown in FIG. 8A that the resistive path is formed in the first storage layer (i.e., gate insulating layer) between the gate electrode GG and the source electrode SS and data '0' is stored in the first storage layer, and no resistive path is formed in the second storage layer (i.e., gate insulating layer) between the gate electrode GG and the drain electrode DD and data '1' is stored in the second storage layer.

For brevity, when data '0' is stored, the first diode 251 will be illustrated and described.

Thus, as shown in FIG. 8A, the first diode 251 may be connected between the gate electrode GG and the source electrode SS in the cell transistor 261 in which data '0' is stored. Based on this point, it may be determined that data '0' is stored during a read operation that will be described later.

As shown in FIG. 8A, in an embodiment of the inventive concept, a voltage of about 0 V may be applied to the VSB, and unselected bit lines BL2, BL3, . . . may be in a floating state.

Similarly to FIG. 8A, in FIG. 8B, a resistive path may be formed in a first storage layer, which is a gate insulating layer disposed between the gate electrode GG and source electrode SS of the cell transistor 361, so that data '0' can be stored and the first diode 351 can be formed.

In an embodiment of the inventive concept, a voltage of about 0 V may be applied to unselected word lines WL0, WL2, WL3, . . . in the case of FIG. 8A, while a VCC voltage serving as a power supply voltage may be applied to the unselected word lines WL0, WL2, WL3, . . . in the case of FIG. 8B.

In FIG. 8A, before the word line WL1 is selected and has the VCC voltage, the bit lines BL0 and BL1 should be precharged to the voltage of about 0 V.

In FIG. 8B, before the word line WL1 is selected and has the voltage of about 0 V, the bit lines BL0 and BL1 should be precharged to the VCC voltage.

In FIG. 8A, when the word line WL1 is selected, the word line WL1 may have the VCC voltage and be put into an electrical conduction state through the first diode 251 connected to the bit line BL0. Thus, the bit line BL0 may have a voltage similar to a voltage obtained by subtracting a diode threshold voltage from the VCC voltage.

In FIG. 8B, when the word line WL1 is selected, the word line WL1 may have the voltage of about 0 V and be put into an electrical conduction state through the first diode 351 connected to the bit line BL0. Thus, the bit line BL0 may have a voltage similar to the diode threshold voltage.

In FIG. 8A, even if the word line WL1 has the VCC voltage, there may be no resistive path in the second storage layer between the gate electrode GG connected to the word line WL1 and the drain electrode DD connected to the bit line BL1 in the cell transistor 261. Thus, the bit line BL1 may remain a previously precharged voltage 0 V.

In FIG. 8B, when the word line WL1 has the voltage of about 0 V, similarly to the case of FIG. 8A, there may be no resistive path in the second storage layer between the gate electrode GG connected to the word line WL1 and the drain electrode DD connected to the bit line BL1 in the cell transistor 363. Thus, the bit line BL1 may remain a previously precharged voltage VCC as the floating state.

Figure 11A:
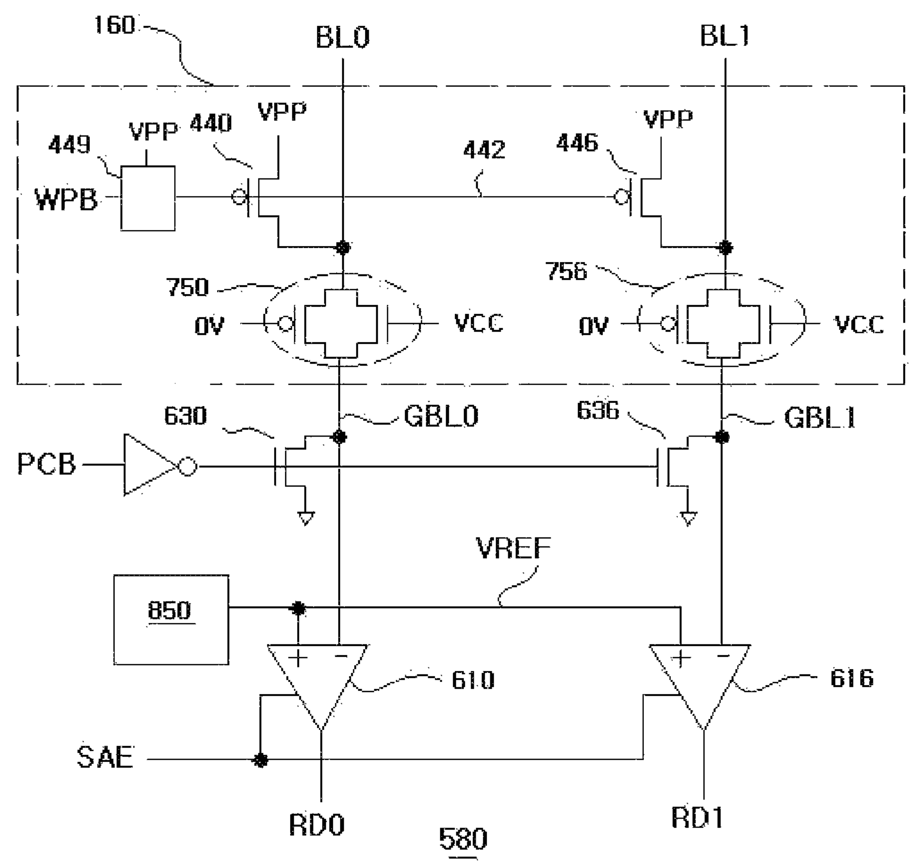
FIG. 11A is a circuit diagram of a partial circuit of a column decoder and a read circuit, which illustrates reading of data stored in a memory array—A using a sense amplifier according to an embodiment of the inventive concept.

FIG. 11A is a circuit diagram showing reading of data stored in a memory cell of a memory array—A according to an embodiment of the inventive concept.

Figure 11B:
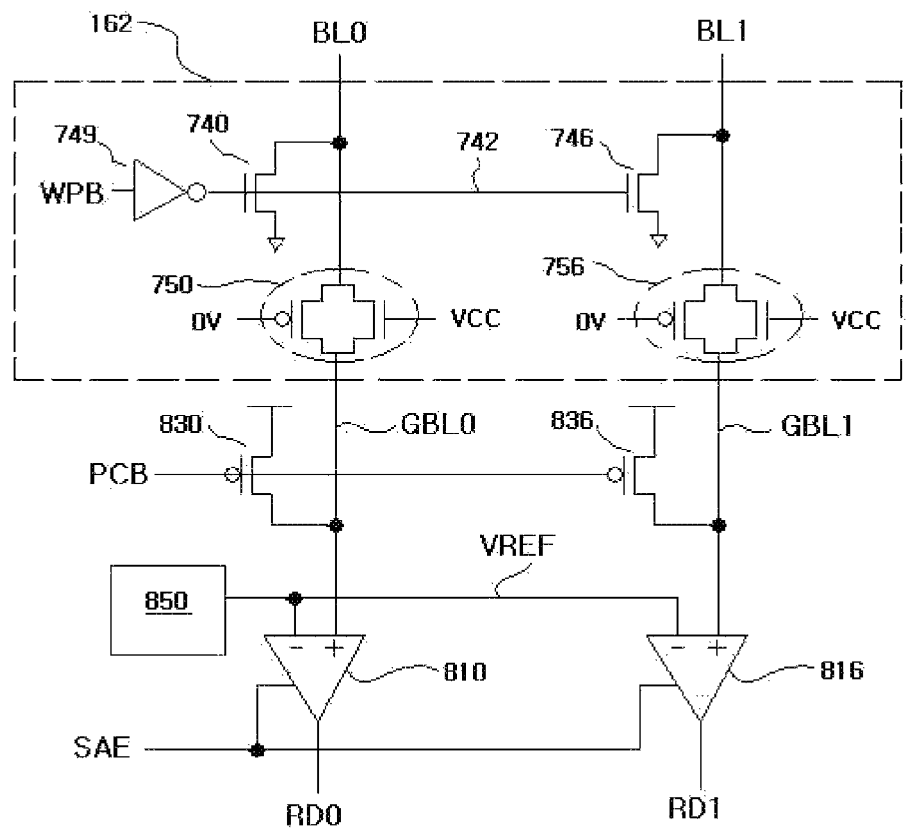
FIG. 11B is a circuit diagram of a partial circuit of a column decoder and a read circuit, which illustrates reading of data stored in a memory array—B using a sense amplifier according to an embodiment of the inventive concept.

FIG. 11B is a circuit diagram showing reading of data stored in a memory cell of a memory array—B according to an embodiment of the inventive concept.

According to an embodiment of the inventive concept, as shown in FIGS. 11A and 11B, bit lines BL0 and BL1 may be connected to global bit lines GBL0 and GBL1 through column decoders 160 and 162 and selected by a column decoding operation.

As shown in FIGS. 11A and 11B, the column decoders 160 and 162 are not additionally provided because the column decoders 160 and 162 are used in common with a write circuit 170. The column decoders 160 and 162 are illustrated to facilitate the understanding of circuits.

In FIGS. 11A and 11B, when a program operation is not performed, a write precharge signal WPB may always remain at a logic level '1,' and a VPP voltage may be adjusted to be a VCC voltage.

In FIG. 11A, N-channel MOS transistors 630 and 636 may be provided to precharge the global bit lines GBL0 and GBL1 to a voltage of about 0 V. In FIG. 11B, P-channel MOS transistors 830 and 836 may be provided to precharge the global bit lines GBL0 and GBL1 to the VCC voltage.

Referring to FIGS. 11A and 11B, sense amplifiers 610, 616, 810, and 816 may be provided to transmit electrical states of the bit lines BL0 and BL1 to the global bit lines GBL0 and GBL1 and read stored data.

As shown in FIGS. 11A and 11B, in an embodiment of the inventive concept, the sense amplifiers 610, 616, 810, and 816 may begin to operate when an SAE signal is sent to a logic level '1,' amplify a voltage difference between a reference voltage VREF and a voltage of input signals GBL0 and GBL1, latch the voltage difference, and output the voltage difference to output terminals RD0 and RD1.

Each of the sense amplifiers 610, 616, 810, and 816 may include a latch-type sense amplifier.

Since the sense amplifiers 610, 616, 810, and 816 are known to one skilled in the art, a detailed description thereof will be omitted.

When data '0' is stored in FIG. 11A, input signals GBL0 and GBL1 of the sense amplifiers 610 and 616 are changed from a voltage of about 0 V to a voltage 'VCC−Vd,' which is obtained by subtracting a diode threshold voltage Vd from the VCC voltage. When data '1' is stored in FIG. 11B, input signals GBL0 and GBL1 of the sense amplifiers 610 and 616 may be maintained at a voltage of about 0 V without variation.

Accordingly, a reference voltage VREF may be half the voltage 'VCC−Vd.' However, to enable high-speed operations, the reference voltage VREF may be lower than half the voltage 'VCC−Vd.'

A case in which the reference voltage VREF is about 0.2 V according to an embodiment of the inventive concept will be described with reference to FIG. 11A.

When the SAE signal is at a logic level '1,' the sense amplifiers 610 and 616 may begin to operate. Thus, when the input signal GBL0 is higher than about 0.2 V, the input signal GBL0 may become higher than the reference voltage VREF, so that a read data output signal RD0 can be sent to a logic level '0.' Also, when the input signal GBL0 is lower than 0.2 V, the read data output signal RD0 may be sent to a logic level '1.'

Figure 12A:
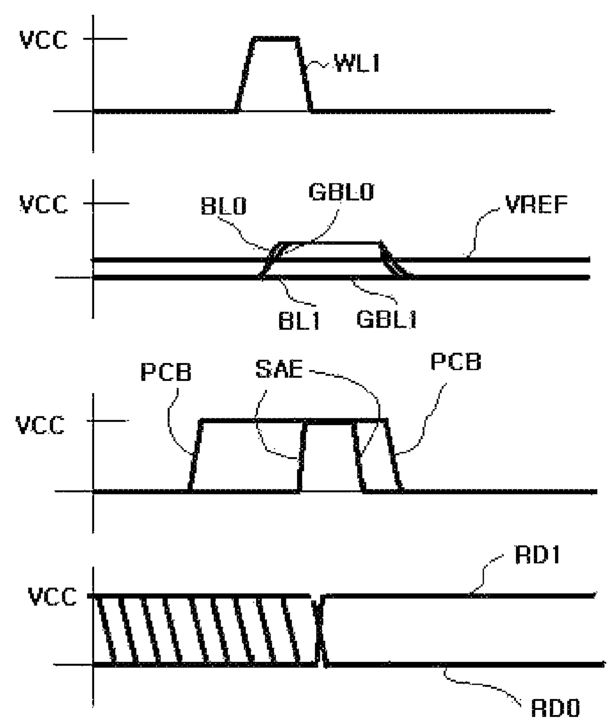
FIG. 12A is a timing diagram showing reading of data stored in an A-type memory device according to an embodiment of the inventive concept.

FIG. 12A is a timing diagram of a read cycle for explaining a read operation according to an embodiment of the inventive concept.

Before a word line WL1 is selected and sent to a logic level '1,' a signal PCB may be sent to a logic level '0,' so that global lines GL0 and GL1 may be precharged to a voltage of about 0 V by precharge transistors 630 and 636.

When data '0' is stored in FIG. 11B, input signals GBL0 and GBL1 of the sense amplifiers 810 and 816 may be changed from a VCC voltage into a diode threshold voltage Vd and data '1' is stored, the input signals GBL0 and GBL1 may be maintained at the VCC voltage without variation.

Accordingly, although the reference voltage VREF is an intermediate value between the VCC voltage and the diode threshold voltage Vd, the reference voltage VREF may be a value closer to the VCC voltage than to the diode threshold voltage Vd to enable high-speed operations.

A case in which the reference voltage VREF is a voltage 'VCC−0.2 V' according to an embodiment of the inventive concept will now be described with reference to FIG. 11A. Hereinafter, when the VCC voltage is about 1.2 V, the reference voltage VREF may be about 1 V.

The reference voltage VREF may be provided by a VREF generator 850.

When an SAE is at a logic level '1,' a sense amplifier may begin to operate. Thus, when an input signal GBL0 is lower than about 1 V, the input signal GBL0 may become lower than the reference voltage VREF, so that a read data output signal RD0 can be sent to a logic level '0.' Also, when the input signal GBL0 is higher than about 1 V, the read data output signal RD0 may be sent to a logic level '1.'

Figure 12B:
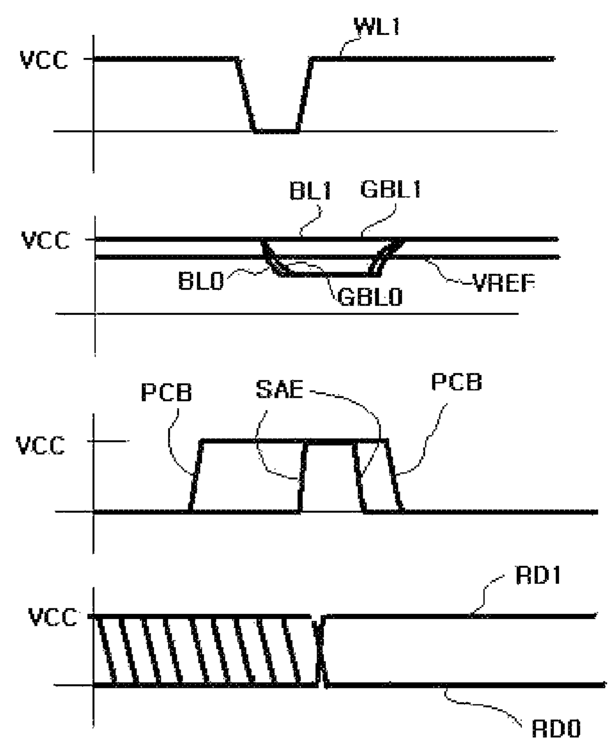
FIG. 12B is a timing diagram showing reading of data stored in a B-type memory device according to an embodiment of the inventive concept.

FIG. 12B is a timing diagram of a read cycle for explaining a read operation according to an embodiment of the inventive concept.

Before a word line WL1 is selected and sent to a logic level '0,' a PCB may be sent to a logic level '0' so that global bit lines GL0 and GL1 can be precharged to a VCC voltage by precharge transistors 830 and 836.

In a read operation of an A-type memory cell, the word line WL1 may be selected, the VCC voltage may be applied to the word line WL1, and the bit line BL0 may be precharged to about 0 V and put into a floating state.

As shown in FIG. 8A, in the cell transistor 261 connected to the word line WL1 and the bit line BL0, since a forward voltage is applied to the first diode 251 formed due to the resistive path generated in the first storage layer, current may flow and a voltage of the bit line BL0 may rise. As a result, the bit line BL0 and the GBL0 may rise from 0 V to the voltage 'VCC−Vd' during a period in which the word line WL is selected. In the present embodiment, it is assumed that the global bit line GBL0 rises from about 0 V to about 0.5 V.

Meanwhile, even if the word line WL1 is selected and the VCC voltage is applied to the word line WL1, since there is no resistive path in the second storage layer of the cell transistor 261 connected to the word line WL1 and the bit line BL1, current may not flow between the word line WL1 and the bit line BL1.

Accordingly, the voltages of the bit line BL1 and the global bit line GBL1 may remain precharged to a voltage of about 0 V.

As shown in FIG. 12A, when an SAE is sent to a logic level '1,' the voltage of the global bit line GBL0 may be elevated by the sense amplifier 610 to a voltage of about 0.5 V, which is higher than the reference voltage VREF of about 0.2 V. Thus, the read data output signal RD0 may be latched at a logic level '0' and output. Also, since the voltage of the global bit line GBL1 is dropped by the sense amplifier 616 to about 0 V, which is lower than the reference voltage VREF of about 0.2 V, the read data output signal RD1 may be latched at a logic level '1' and output.

Thereafter, the voltage of the word line WL1 may become about 0 V and the SAE signal may be sent to a logic level '0,' and thus operations of the sense amplifiers 610 and 616 may be ended. As shown in FIG. 12A, the PCB may be sent to a logic level '0' and the global bit lines GBL0 and GBL1 may be precharged again to about 0 V, so that a read cycle operation can be ended.

In a read operation of a B-type memory cell, the word line WL1 may be selected, a voltage of about 0 V may be applied to the word line WL1, and a voltage of the bit line BL0 may be precharged to a VCC voltage and put into a floating state.

As shown in FIG. 8B, in the cell transistor 361 connected to the word line WL1 and the bit line BL0, since a forward voltage is applied to the first diode 351 formed due to the resistive path generated in the gate insulating layer, current may flow so that the voltage of the bit line BL0 can be dropped. As a result, the voltages of the bit line BL0 and the global bit line GBL0 may be dropped from the VCC voltage to the diode threshold voltage 'Vd' during a period in which the word line WL1 is selected. In the present embodiment, it is assumed that the voltage of the global bit line GBL0 is dropped from the VCC voltage to about 0.5 V.

Meanwhile, even if the word line WL1 is selected and a voltage of about 0 V is applied to the word line WL1, since there is no resistive path in the second storage layer of the cell transistor 363 connected to the word line WL1 and the bit line BL1, current may not flow between the word line WL1 and the bit line BL1.

Accordingly, the voltages of the bit line BL1 and the global bit line GBL1 may be maintained at the VCC voltage without variation.

As shown in FIG. 12B, when the SAE signal is sent to a logic level '1,' the voltage of the global bit line GBL0 may be sent by the sense amplifier 810 to about 0.5 V, which is lower than the reference voltage VREF of about 1 V. Thus, a read data output signal RD0 may be latched at a logic level '0' and output. Also, since the voltage of the global bit line GBL1 is sent by the sense amplifier 816 to the VCC voltage, which is higher than the reference voltage VREF of about 1 V, a read data output signal RD1 may be latched at a logic level '1' and output.

Thereafter, the voltage of the word line WL1 may become about 0 V, and the SAE signal may be sent to a logic level '0,' so operations of the sense amplifiers 810 and 816. As shown in FIG. 12B, a PCB may be sent to a logic level '0,' and the global bit lines GBL0 and GBL1 may be precharged again to the VCC voltage, so a read cycle operation may be finished.

Figure 13:
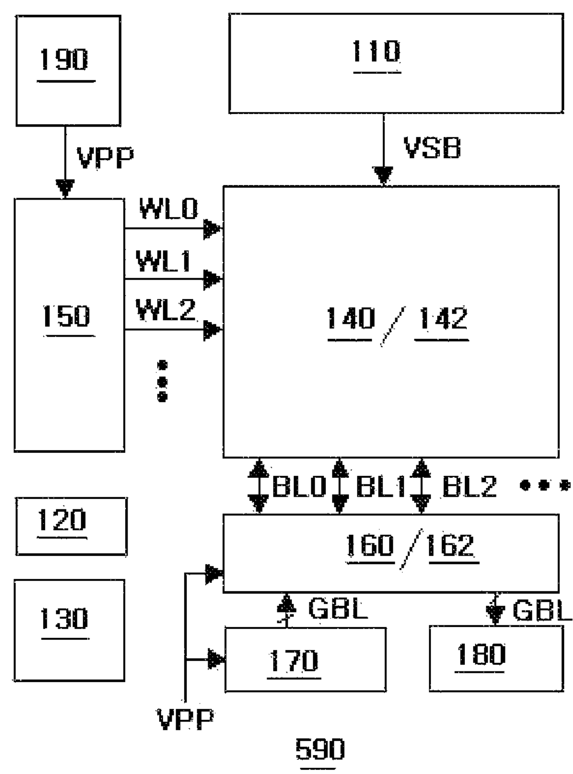
FIG. 13 is a construction diagram of the entire memory device according to an embodiment of the inventive concept.

FIG. 13 shows the overall configuration of a memory device according to an embodiment of the inventive concept.

The overall memory device according to the inventive concept may include a memory array in which a plurality of memory cells are arranged, a VSB supply unit configured to generate a voltage VSB required for the memory array, a row decoder configured to select a word line from the memory array, a VPP generator configured to generate a VPP voltage and supply the VPP voltage to the row decoder, a column decoder, and a write circuit, the column decoder configured to select a bit line, a write circuit configured to receive a data bus from an input/output (I/O) unit and transmit the data bus to a global bit line bus GBL under the control of a controller, a read circuit required for a read operation including transmitting stored data to the global bit line bus GBL, sensing and amplifying an electrical state of the global bit line bus using a sense amplifier, converting the sensed and amplified electrical state into a digital signal, and transmitting the digital signal to the I/O unit, a controller configured to control the inside of the memory device, and the I/O unit configured to allow the outside of the memory device to interface with the inside of the memory device.

The configuration of the memory device will now be briefly described. The memory device may include the above-described memory array 140 or 142 and a VSB supply unit 110 configured to generate the voltage VSB required for the memory array 140 or 142.

A high-voltage power source VPP may be required for the program operation. The VPP generator 190 may generate the VPP voltage and supply the VPP voltage to the row decoder 150, the column decoder 160 or 162, and a write circuit 170.

When the program operation is not performed, the VPP voltage may be adjusted to a voltage VCC by the VPP generator 190.

Furthermore, the memory device may include the row decoder 150 configured to select a word line form the memory array 140 or 142 and the column decoder 160 configured to select a bit line.

Referring to FIG. 13, the row decoder 150 and the column decoder 160 or 162 may receive an address bus from the I/O unit 130, be controlled by a controller 120, and decode an address. The row decoder 150 may receive the VPP voltage from the VPP generator 190 because the VPP voltage is required for a program operation.

The memory device may include the write circuit 170 required for a data write operation. The write circuit 170 may receive the data bus from the I/O unit 130 and transmit the data bus to the global bit line bus GBL (GBL0, GBL1, GBL2, . . . ) under the control of the controller 120.

Referring to FIG. 13, the memory device may include a read circuit 180 required for a data read operation. Stored data may be transmitted to the global bit line bus GBL (GBL0, GBL1, GBL2, . . . ), and the sense amplifier may sense and amplify an electrical state of the global bit line bus GBL, convert the sensed and amplified electrical state into a digital signal, and transmit the digital signal to the I/O unit 130.

The I/O unit 130 may allow the outside of the memory device to interface with the inside thereof. The controller 120 may receive commands required for the write and read operations from the I/O device 130, analyze the commands in detail, and control circuits related with the commands.

Construction of the memory device according to the embodiment of the inventive concept may be modified. For example, the memory device is not limited to a one-time programmable (OTP) device and a multi-time programmable (MTP) device and may be replaced by a redundancy repair including a fuse, which may be used in various semiconductor devices, such as a dynamic random access memory (DRAM) or a static random access memory (SRAM).

In comparison to a conventional memory cell capable of storing 2-bit data using three transistors, the inventive concept provides a memory cell capable of storing 2-bit data using one cell transistor. Thus, the inventive concept can elevate the integration density of a memory device to be about three times higher than that of a conventional memory device on the basis of the number of transistors.

Furthermore, since second source regions or second drain regions of memory cells can be directly connected to one another without passing through contacts, a horizontal area of a memory array can be reduced.

In a conventional memory cell, a storage transistor includes a thin oxide layer, while an access transistor for applying a high voltage for a program operation includes a thick oxide layer. However, in a memory cell according to the inventive concept, when a gate insulating layer includes an oxide layer, only one thin oxide transistor may be basically used, thereby facilitating a process of manufacturing a memory array and minimizing the area of the memory array.

In addition, when a resistive path is generated by applying a high voltage to a gate insulating layer, an insulating isolation layer may cut off the resistive path connected to a semiconductor substrate.

Also, when the gate insulating layer is a variable resistor, an integration density can be elevated, and a program operation can be performed several times.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A nonvolatile memory device comprising:

a semiconductor substrate; a gate insulating layer formed on the semiconductor substrate; a gate stacked on the gate insulating layer;

a source region formed in the semiconductor substrate the source region includes a first source region including a region intersecting the gate insulating layer and a second source region corresponding to the remaining source region other than the first source region, the first source region is lightly doped with a dopant, and the second source region is heavily doped with a dopant;

a drain region formed in the semiconductor substrate, the drain region includes a first drain region including a region intersecting the gate insulating layer and a second drain region corresponding to the remaining drain region other than the first drain region, the first drain region is lightly doped with a dopant, and the second drain region is heavily doped with a dopant; and an insulating isolation layer is formed in a region including a channel region between the source and drain regions in the semiconductor substrate, wherein the gate has a lower portion including a metal layer, the gate insulating layer includes an insulating layer or a variable resistor, a portion of the gate insulating layer or the variable resistor between the gate and the first source region serves as a first storage layer, and a portion of the gate insulating layer or the variable resistor between the gate and the first drain region serves as a second storage layer, wherein, when the first storage layer is in an electrical conduction state, the gate and the first source region form a first diode, or when the second storage layer is in an electrical conduction state, the gate and the first drain region form a second diode.

2. The device of claim 1, wherein sidewall spacers are further formed on sidewalls of the gate, and the insulating isolation layer is formed using a shallow trench isolation (STI) technique.

3. The device of claim 1, wherein a gate electrode connected to the gate is connected to a word line, a source electrode connected to the source region or a drain electrode connected to the drain region is connected to a bit line, or the gate electrode is connected to the bit line, and the source electrode or the drain electrode is connected to the word line.

4. The device of claim 1, wherein the second source region or the second drain region of one memory cell runs in one direction and is shared with and is directly connected to a second source region or a second drain region of another memory cell arranged in the one direction without passing through a contact.

5. The device of claim 1, wherein the gate insulating layer or the variable resistor is divided by the insulating isolation layer into the first storage layer and the second storage layer, and the insulating isolation layer prevents generation of a resistive path in the gate insulating layer or the variable resistor between the gate and the semiconductor substrate during a program operation of the insulating isolation layer.

6. The device of claim 1, wherein the metal layer includes a metal, a silicide, a metal compound, or a material having diode characteristics when bonded to a semiconductor.

7. The device of claim 1, wherein, during a program operation performed on a memory array in which a gate electrode connected to the gate is connected to a word line and a source electrode and a drain electrode respectively connected to the source and drain regions are respectively connected to bit lines, when a word line is selected, a VPP voltage is applied to the selected word line, and other unselected word lines are precharged to a voltage of about 0 V and put into a floating state, or during a program operation performed on a memory array in which the gate electrode is connected to a bit line and the source and drain electrodes are respectively connected to word lines, when a word line is selected, a voltage of about 0 V is applied to the selected word line, and other unselected word lines are precharged to a VPP voltage and put into a floating state, when the first bit cell is programmed, a voltage of about 0 V is applied to the source electrode, when the second bit cell is programmed, a voltage of about 0 V is applied to the drain electrode, when the first bit cell is prevented from being programmed during the program operation, the source electrode is put into the floating state, and when the second bit cell is prevented from being programmed during the program operation, the drain electrode is put into the floating state.

8. The device of claim 1, wherein a write circuit includes a bit line precharge circuit including transistors to be controlled in response to a write precharge signal, wherein, when a gate electrode connected to the gate is connected to a word line and source and drain electrodes respectively connected to the source and drain regions are respectively connected to bit lines, a column decoder precharges bit lines to a VPP voltage, and when the gate electrode connected to the gate is connected to a bit line and the source and drain electrodes are respectively connected to word lines, the column decoder precharges bit lines to a voltage of about 0 V.

9. The device of claim 1, wherein a read circuit required for a read operation includes bit lines connected to global bit lines and configured to be selected due to a column decoding operation and a sense amplifier configured to transmit electrical states of the bit lines to the global bit lines and read stored data, wherein, when a gate electrode connected to the gate is connected to a word line and source and drain electrodes respectively connected to the source and drain regions are respectively connected to bit lines, the device further includes a transistor configured to precharge the global bit lines to a voltage of about 0 V, and when the gate electrode is connected to a bit line and the source and drain electrodes are respectively connected to word lines, the device further includes a transistor configured to precharge the global bit lines to a VCC voltage.

10. A nonvolatile memory device comprising:

a semiconductor substrate;

a gate insulating layer formed on the semiconductor substrate;

a gate stacked on the gate insulating layer;

a source region formed in the semiconductor substrate—the source region includes a first source region including a region intersecting the gate insulating layer and a second source region corresponding to the remaining source region other than the first source region;

a drain region formed in the semiconductor substrate—the drain region includes a first drain region including a region intersecting the gate insulating layer and a second drain region corresponding to the remaining drain region other than the first drain region; and an insulating isolation layer is formed in a region including a channel region between the source and drain regions in the semiconductor substrate, wherein the first and the second source regions form a first diode structure and the first and the second drain regions form a second diode structure, or a source electrode connected to the second source region and the second source region form the first diode structure and a drain electrode connected to the second drain region form the second diode structure, and the gate includes a conductive layer, and the gate insulating layer includes an insulating layer or a variable resistor, a portion of the gate insulating layer or the variable resistor between the gate and the first source region serves as a first storage layer, or a portion of the gate insulating layer or the variable resistor between the gate and the first drain region serves as a second storage layer, wherein the first diode is connected to the first storage layer in a series and/or the second diode is connected to the second storage layer in a series.

11. The device of claim 10, wherein the first and second source regions of the first diode structure or the first and second drain regions of the second diode structure respectively include an N-type semiconductor and a P-type semiconductor or respectively include a P-type semiconductor and an N-type semiconductor to form a PN junction diode, respectively include a semiconductor and a metal or respectively include a semiconductor and a metal to form a Schottky diode, or respectively include other materials having diode characteristics.

12. The device of claim 10, further comprising a third source region disposed between the first source region and the semiconductor substrate and a third drain region disposed between the first drain region and the semiconductor substrate.

13. The device of claim 10, wherein sidewall spacers are further formed on sidewalls of the gate, and the insulating isolation layer is formed using a shallow trench isolation (STI) technique.

14. The device of claim 10, wherein a gate electrode connected to the gate is connected to a word line, a source electrode connected to the source region or a drain electrode connected to the drain region is connected to a bit line, or the gate electrode is connected to the bit line, and the source electrode or the drain electrode is connected to the word line.

15. The device of claim 10, wherein the second source region or the second drain region of one memory cell runs in one direction and is shared with and is directly connected to a second source region or a second drain region of another memory cell arranged in the one direction without passing through a contact.

16. The device of claim 10, wherein the gate insulating layer is divided by the insulating isolation layer into the first storage layer and the second storage layer, and the insulating isolation layer prevents generation of a resistive path in the gate insulating layer between the gate and the semiconductor substrate during a program operation of the insulating isolation layer.

17. The device of claim 10, wherein the insulating isolation layer is further expanded to the source region or the drain region.

18. The device of claim 10, wherein the gate insulating layer or the variable resistor is divided by the insulating isolation layer into the first storage layer and the second storage layer, and the insulating isolation layer prevents generation of a resistive path in the gate insulating layer or the variable resistor between the gate and the semiconductor substrate during a program operation of the insulating isolation layer.

19. A nonvolatile memory device comprising:

a semiconductor substrate;

a gate insulating layer formed on the semiconductor substrate;

a gate stacked on the gate insulating layer;

a source region formed in the semiconductor substrate the source region includes a first source region including a region intersecting the gate insulating layer and a second source region corresponding to the remaining source region other than the first source region, the first source region is lightly doped with a dopant, and the second source region is heavily doped with a dopant; and an insulating isolation layer is formed in a region including a channel region in the semiconductor substrate and expands to a drain region, wherein the gate has a lower portion including a metal layer, the gate insulating layer includes an insulating layer or a variable resistor, a portion of the gate insulating layer or the variable resistor between the gate and the first source region serves as a first storage layer configured to store data, and the gate including the first storage layer and the source region constitute a first bit cell, wherein, when the first storage layer is in an electrical conduction state, the gate and the first source region form a first diode.

20. The device of claim 19, wherein sidewall spacers are further formed on sidewalls of the gate, and the insulating isolation layer is formed using a shallow trench isolation (STI) technique.

21. The device of claim 19, wherein a gate electrode connected to the gate is connected to a word line, a source electrode connected to the source region or a drain electrode connected to the drain region is connected to a bit line, or the gate electrode is connected to the bit line, and the source electrode or the drain electrode is connected to the word line.

22. The device of claim 19, wherein the second source region or the second drain region of one memory cell runs in one direction and is shared with and is directly connected to a second source region or a second drain region of another memory cell arranged in the one direction without passing through a contact.

23. The device of claim 19, wherein the metal layer includes a metal, a silicide, a metal compound, or a material having diode characteristics when bonded to a semiconductor.

24. The device of claim 19, wherein, during a program operation performed on a memory array in which a gate electrode connected to the gate is connected to a word line and a source electrode and a drain electrode respectively connected to the source and drain regions are respectively connected to bit lines, when a word line is selected, a VPP voltage is applied to the selected word line, and other unselected word lines are precharged to a voltage of about 0 V and put into a floating state, or during a program operation performed on a memory array in which the gate electrode is connected to a bit line and the source and drain electrodes are respectively connected to word lines, when a word line is selected, a voltage of about 0 V is applied to the selected word line, and other unselected word lines are precharged to a VPP voltage and put into a floating state, when the first bit cell is programmed, a voltage of about 0 V is applied to the source electrode, when the second bit cell is programmed, a voltage of about 0 V is applied to the drain electrode, when the first bit cell is prevented from being programmed during the program operation, the source electrode is put into the floating state, and when the second bit cell is prevented from being programmed during the program operation, the drain electrode is put into the floating state.

25. The device of claim 19, wherein a write circuit includes a bit line precharge circuit including transistors to be controlled in response to a write precharge signal, wherein, when a gate electrode connected to the gate is connected to a word line and source and drain electrodes respectively connected to the source and drain regions are respectively connected to bit lines, a column decoder precharges bit lines to a VPP voltage, and when the gate electrode connected to the gate is connected to a bit line and the source and drain electrodes are respectively connected to word lines, the column decoder precharges bit lines to a voltage of about 0 V.

26. The device of claim 19, wherein a read circuit required for a read operation includes bit lines connected to global bit lines and configured to be selected due to a column decoding operation and a sense amplifier configured to transmit electrical states of the bit lines to the global bit lines and read stored data, wherein, when a gate electrode connected to the gate is connected to a word line and source and drain electrodes respectively connected to the source and drain regions are respectively connected to bit lines, the device further includes a transistor configured to precharge the global bit lines to a voltage of about 0 V, and when the gate electrode is connected to a bit line and the source and drain electrodes are respectively connected to word lines, the device further includes a transistor configured to precharge the global bit lines to a VCC voltage.

27. The device of claim 19, wherein the gate insulating layer or the variable resistor is divided by the insulating isolation layer into the first storage layer and the second storage layer, and the insulating isolation layer prevents generation of a resistive path in the gate insulating layer or the variable resistor between the gate and the semiconductor substrate during a program operation of the insulating isolation layer.

28. A nonvolatile memory device comprising:

a semiconductor substrate;

a gate insulating layer formed on the semiconductor substrate;

a gate stacked on the gate insulating layer;

a drain region formed in the semiconductor substrate—the drain region includes a first drain region including a region intersecting the gate insulating layer and a second drain region corresponding to the remaining drain region other than the first drain region, the first drain region is lightly doped with a dopant, and the second drain region is heavily doped with a dopant; and an insulating isolation layer is formed in a region including a channel region in the semiconductor substrate and extends to a source region, wherein the gate has a lower portion including a metal layer, the gate insulating layer includes an insulating layer or a variable resistor, a portion of the gate insulating layer or the variable resistor between the gate and the first drain region serves as a second storage layer configured to store data, and the gate including the second storage layer and the drain region constitute a second bit cell, wherein, when the second storage layer is in an electrical conduction state, the gate and the first drain region form a second diode.

29. The device of claim 28, wherein sidewall spacers are further formed on sidewalls of the gate, and the insulating isolation layer is formed using a shallow trench isolation (STI) technique.

30. The device of claim 28, wherein a gate electrode connected to the gate is connected to a word line, a source electrode connected to the source region or a drain electrode connected to the drain region is connected to a bit line, or the gate electrode is connected to the bit line, and the source electrode or the drain electrode is connected to the word line.

31. The device of claim 28, wherein the second source region or the second drain region of one memory cell runs in one direction and is shared with and is directly connected to a second source region or a second drain region of another memory cell arranged in the one direction without passing through a contact.

32. The device of claim 28, wherein the metal layer includes a metal, a silicide, a metal compound, or a material having diode characteristics when bonded to a semiconductor.

33. The device of claim 28, wherein, during a program operation performed on a memory array in which a gate electrode connected to the gate is connected to a word line and a source electrode and a drain electrode respectively connected to the source and drain regions are respectively connected to bit lines, when a word line is selected, a VPP voltage is applied to the selected word line, and other unselected word lines are precharged to a voltage of about 0 V and put into a floating state, or during a program operation performed on a memory array in which the gate electrode is connected to a bit line and the source and drain electrodes are respectively connected to word lines, when a word line is selected, a voltage of about 0 V is applied to the selected word line, and other unselected word lines are precharged to a VPP voltage and put into a floating state, when the first bit cell is programmed, a voltage of about 0 V is applied to the source electrode, when the second bit cell is programmed, a voltage of about 0 V is applied to the drain electrode, when the first bit cell is prevented from being programmed during the program operation, the source electrode is put into the floating state, and when the second bit cell is prevented from being programmed during the program operation, the drain electrode is put into the floating state.

34. The device of claim 28, wherein a write circuit includes a bit line precharge circuit including transistors to be controlled in response to a write precharge signal, wherein, when a gate electrode connected to the gate is connected to a word line and source and drain electrodes respectively connected to the source and drain regions are respectively connected to bit lines, a column decoder precharges bit lines to a VPP voltage, and when the gate electrode connected to the gate is connected to a bit line and the source and drain electrodes are respectively connected to word lines, the column decoder precharges bit lines to a voltage of about 0 V.

35. The device of claim 28, wherein a read circuit required for a read operation includes bit lines connected to global bit lines and configured to be selected due to a column decoding operation and a sense amplifier configured to transmit electrical states of the bit lines to the global bit lines and read stored data, wherein, when a gate electrode connected to the gate is connected to a word line and source and drain electrodes respectively connected to the source and drain regions are respectively connected to bit lines, the device further includes a transistor configured to precharge the global bit lines to a voltage of about 0 V, and when the gate electrode is connected to a bit line and the source and drain electrodes are respectively connected to word lines, the device further includes a transistor configured to precharge the global bit lines to a VCC voltage.

36. The device of claim 28, wherein the gate insulating layer or the variable resistor is divided by the insulating isolation layer into the first storage layer and the second storage layer, and the insulating isolation layer prevents generation of a resistive path in the gate insulating layer or the variable resistor between the gate and the semiconductor substrate during a program operation of the insulating isolation layer.

* * * * *